United States Patent
Hsieh et al.

(10) Patent No.: US 11,527,563 B2
(45) Date of Patent: Dec. 13, 2022

(54) PHOTODETECTOR USING A BURIED GATE ELECTRODE FOR A TRANSFER TRANSISTOR AND METHODS OF MANUFACTURING THE SAME

(71) Applicant: Taiwan Semiconductor Manufacturing Company Limited, Hsinchu (TW)

(72) Inventors: Feng-Chien Hsieh, Pingtung (TW); Yun-Wei Cheng, Taipei (TW); Wei-Li Hu, Tainan (TW); Kuo-Cheng Lee, Tainan (TW); Hsin-Chi Chen, Tainan (TW)

( * ) Notice: Subject to any disclaimer, the term of this patent is extended or adjusted under 35 U.S.C. 154(b) by 215 days.

(21) Appl. No.: 16/852,674

(22) Filed: Apr. 20, 2020

(65) Prior Publication Data
US 2021/0327932 A1 Oct. 21, 2021

(51) Int. Cl.
*H01L 27/148* (2006.01)
*H01L 27/146* (2006.01)

(52) U.S. Cl.
CPC .... *H01L 27/14614* (2013.01); *H01L 27/1464* (2013.01); *H01L 27/14621* (2013.01); *H01L 27/14627* (2013.01); *H01L 27/14629* (2013.01); *H01L 27/14645* (2013.01); *H01L 27/14685* (2013.01); *H01L 27/14689* (2013.01)

(58) Field of Classification Search
None
See application file for complete search history.

(56) References Cited

U.S. PATENT DOCUMENTS

2006/0138486 A1 6/2006 Lim
2006/0289911 A1 12/2006 Lee et al.
(Continued)

FOREIGN PATENT DOCUMENTS

KR 100638260 B1 10/2006
KR 20070035650 A 4/2007
(Continued)

OTHER PUBLICATIONS

Taiwan Patent Office; Application No. 109130828; Office Action dated Mar. 5, 2021; 8 pages.
(Continued)

*Primary Examiner* — Ali Naraghi
(74) *Attorney, Agent, or Firm* — The Marbury Law Group, PLLC

(57) ABSTRACT

A semiconductor structure includes a photodetector, which includes a substrate semiconductor layer having a doping of a first conductivity type, a second-conductivity-type photodiode layer that forms a p-n junction with the substrate semiconductor layer, a floating diffusion region that is laterally spaced from the second-conductivity-type photodiode layer, and a transfer gate electrode including a lower transfer gate electrode portion that is formed within the substrate semiconductor layer and located between the second-conductivity-type photodiode layer and the floating diffusion region. The transfer gate electrode may laterally surround the p-n junction, and may provide enhanced electron transmission efficiency from the p-n junction to the floating diffusion region. An array of photodetectors may be used to provide an image sensor.

20 Claims, 25 Drawing Sheets

(56) References Cited

U.S. PATENT DOCUMENTS

| | | | |
|---|---|---|---|
| 2008/0277693 A1 | 11/2008 | Mauritzson et al. | |
| 2012/0043589 A1* | 2/2012 | Nozaki | H01L 27/14616 |
| | | | 257/225 |
| 2012/0217558 A1* | 8/2012 | Togashi | H01L 27/14614 |
| | | | 257/292 |
| 2013/0175582 A1* | 7/2013 | Ihara | H01L 27/14647 |
| | | | 257/E27.15 |
| 2014/0312391 A1* | 10/2014 | Ihara | H01L 27/14614 |
| | | | 257/229 |
| 2015/0155328 A1* | 6/2015 | Park | H01L 27/14627 |
| | | | 257/292 |
| 2017/0162622 A1 | 6/2017 | Chuang et al. | |
| 2019/0355778 A1* | 11/2019 | Zheng | H01L 27/14656 |
| 2020/0021760 A1 | 1/2020 | Kobayashi et al. | |

FOREIGN PATENT DOCUMENTS

| | | | | |
|---|---|---|---|---|
| KR | 20160022456 A | 3/2016 | | |
| TW | 201210007 A | 3/2012 | | |
| TW | 201413925 A | 4/2014 | | |
| TW | 202005131 A | 1/2020 | | |
| WO | WO-2020026856 A1 * | 2/2020 | | H01L 27/14603 |

OTHER PUBLICATIONS

German Patent and Trademark Office, Application No. 102020111491.5, Office Action dated Dec. 21, 2020, 9 pages.

Korean Patent Office; Application No. 10-2020-0089507 Office Action dated May 30, 2022; 7 pages.

* cited by examiner

PHOTODETECTOR USING A BURIED GATE ELECTRODE FOR A TRANSFER TRANSISTOR AND METHODS OF MANUFACTURING THE SAME

BACKGROUND

Semiconductor image sensors are used to sense electromagnetic radiation such as visible range light, infrared radiation, and/or ultraviolet light. Complementary metal-oxide-semiconductor (CMOS) image sensors (CIS) and charge-coupled device (CCD) sensors are used in various applications such as digital cameras or incorporated cameras in mobile devices. These devices utilize an array of pixels (which may include photodiodes and transistors) to detect radiation using photogeneration of electron-hole pairs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
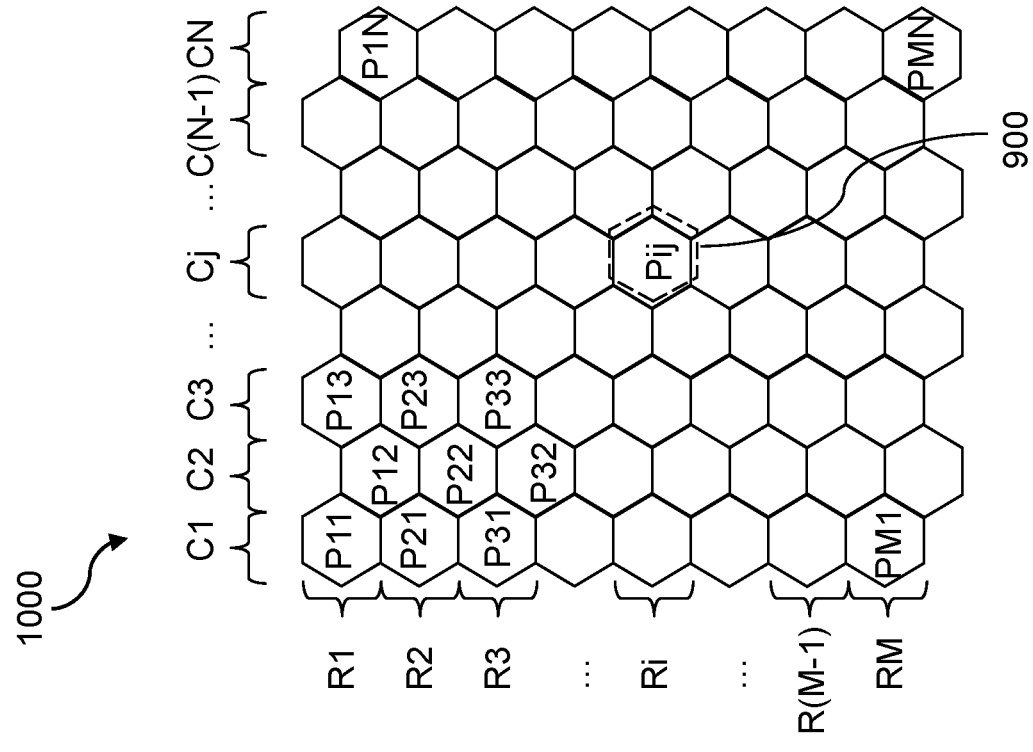
FIG. 1B is a plan view of a second configuration for an array of pixels of an image sensor according to another embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to a photodetector including a buried gate electrode for a transfer transistor and methods of manufacturing the same.

Generally, the structures and methods of the present disclosure may be used to provide a photodetector including a transfer transistor that contains a transfer gate electrode formed within a substrate semiconductor layer. As such, the transfer gate electrode extends from a top surface of the substrate semiconductor layer into the substrate semiconductor layer, and functions as a buried transfer gate electrode. The transfer gate electrode may be formed in a trench that is formed in the substrate semiconductor layer. The transfer gate electrode may laterally surround a p-n junction of the photodetector. As such, the light generation region of the photodetector may be laterally surrounded by, and may be electrically isolated by, the transfer gate electrode. Further, electron transmission efficiency of the photodetector may be improved by the buried transfer gate electrode. The buried transfer gate electrode of embodiments of the present disclosure may overcome challenges in electrical isolation of a photodetector that relies on implantation of electrical dopants. The various features and aspects of embodiments of the present disclosure are now described in detail with reference to drawings of the instant application.

Figure 1A:
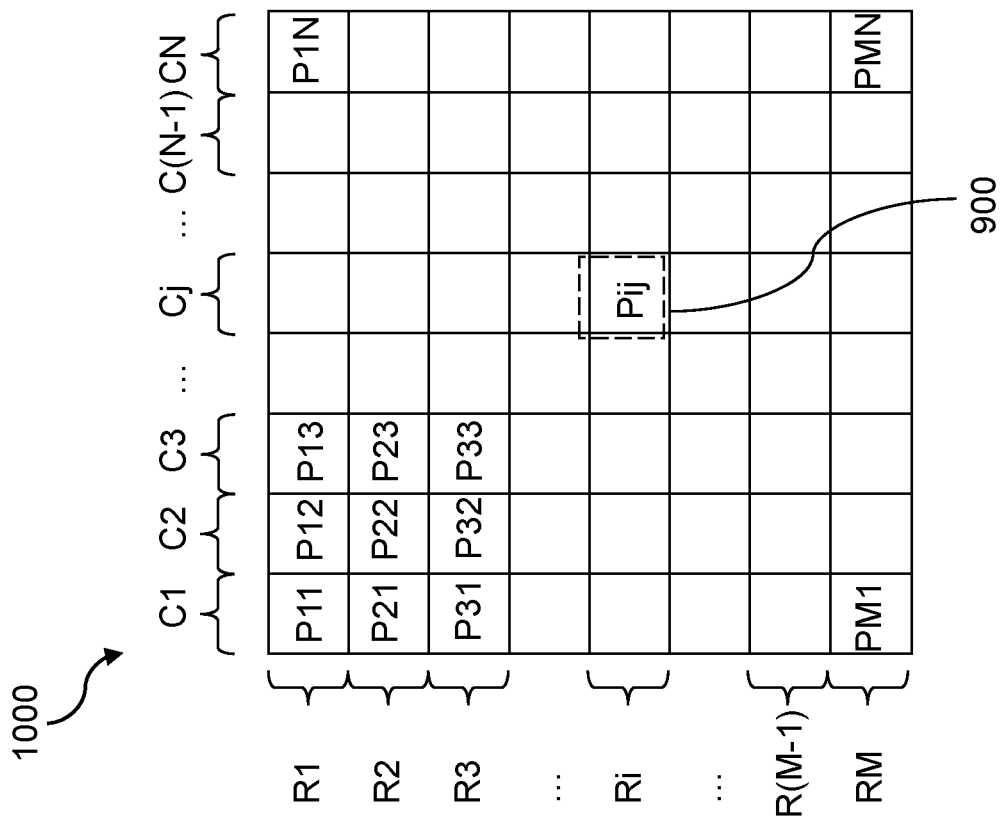
FIG. 1A is a plan view of a first configuration for an array of pixels of an image sensor according to an embodiment of the present disclosure.

Referring to FIGS. 1A and 1B, a first configuration for an array 1000 of pixels 900 of an image sensor and a second configuration of an array 1000 of pixels 900 of an image sensor are illustrated in a respective plan view. The image sensor may be a backside illuminated (BSI) image sensor device. However, it should be appreciated that embodiments of the disclosure may be used in a front side illuminated (FSI) image sensor.

Each pixel 900 represents a smallest unit area for the purpose of generating an image from the image sensor. The region including the array 1000 of pixels 900 is herein referred to as a pixel array region. The pixels 900 in the pixel array region may be arranged in rows and columns. For example, the pixel array region may include M rows and N columns, in which M and N are integers in a range from 1 to $2^{16}$, such as from $2^8$ to $2^{14}$. The rows of pixels 900 may be consecutively numbered with integers that range from 1 to M, and the columns of pixels 900 may be consecutively numbered with integers that range from 1 to N. A pixel $P_{ij}$ refers to a pixel 900 in the i-th row and in the j-th column.

Each pixel 900 includes at least one photodetector that is configured to detect radiation of a given wavelength range. Each pixel 900 may include a plurality of photodetectors configured to detect radiation of a respective wavelength range, which may be different for each of the plurality of photodetectors. In one embodiment, each pixel 900 may include a plurality of subpixels, each of which including a respective combination of a photodetector and an electronic circuit configured to detect radiation that impinged into the photodetector. For example, a pixel 900 may include a subpixel configured to detect radiation in a red wavelength range (such as a range from 635 nm to 700 nm), a subpixel configured to detect radiation in a green wavelength range (such as a range from 520 nm to 560 nm), and a subpixel configured to detect radiation in a blue wavelength range (such as a range from 450 nm to 490 nm). Such subpixels are referred to as a red subpixel, green subpixel, and a blue subpixel, respectively.

Generally, a pixel 900 generates information associated with impinging radiation for a unit detection area. A subpixel may generate information regarding the intensity of the impinging radiation within a specific wavelength range as detected within a region of the unit detection area. A monochromatic pixel 900 may include only a single subpixel. A pixel 900 configured to detect spectral distribution of impinging radiation includes multiple subpixels having at least two different detection wavelength ranges. Photodetectors in a pixel array region may include photodiodes, complementary metal-oxide-semiconductor (CMOS) image sensors, charged coupling device (CCD) sensors, active sensors, passive sensors, other applicable sensors, or a combination thereof.

Figure 2A:
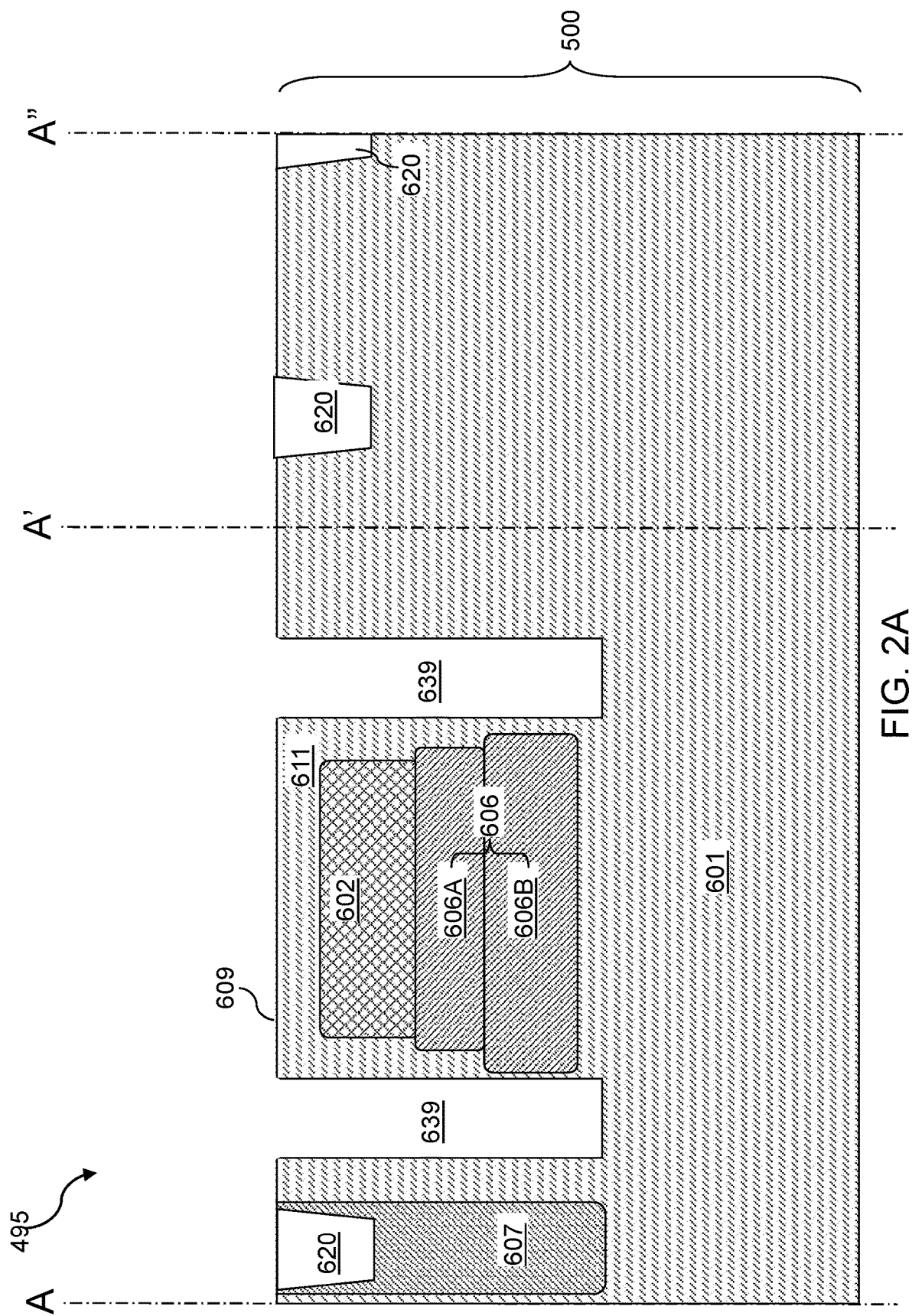
FIG. 2A is a vertical cross-sectional view of a first exemplary structure for forming a subpixel at a processing step after formation of a trench into a substrate semiconductor layer according to a first embodiment of the present disclosure.
Figure 2B:
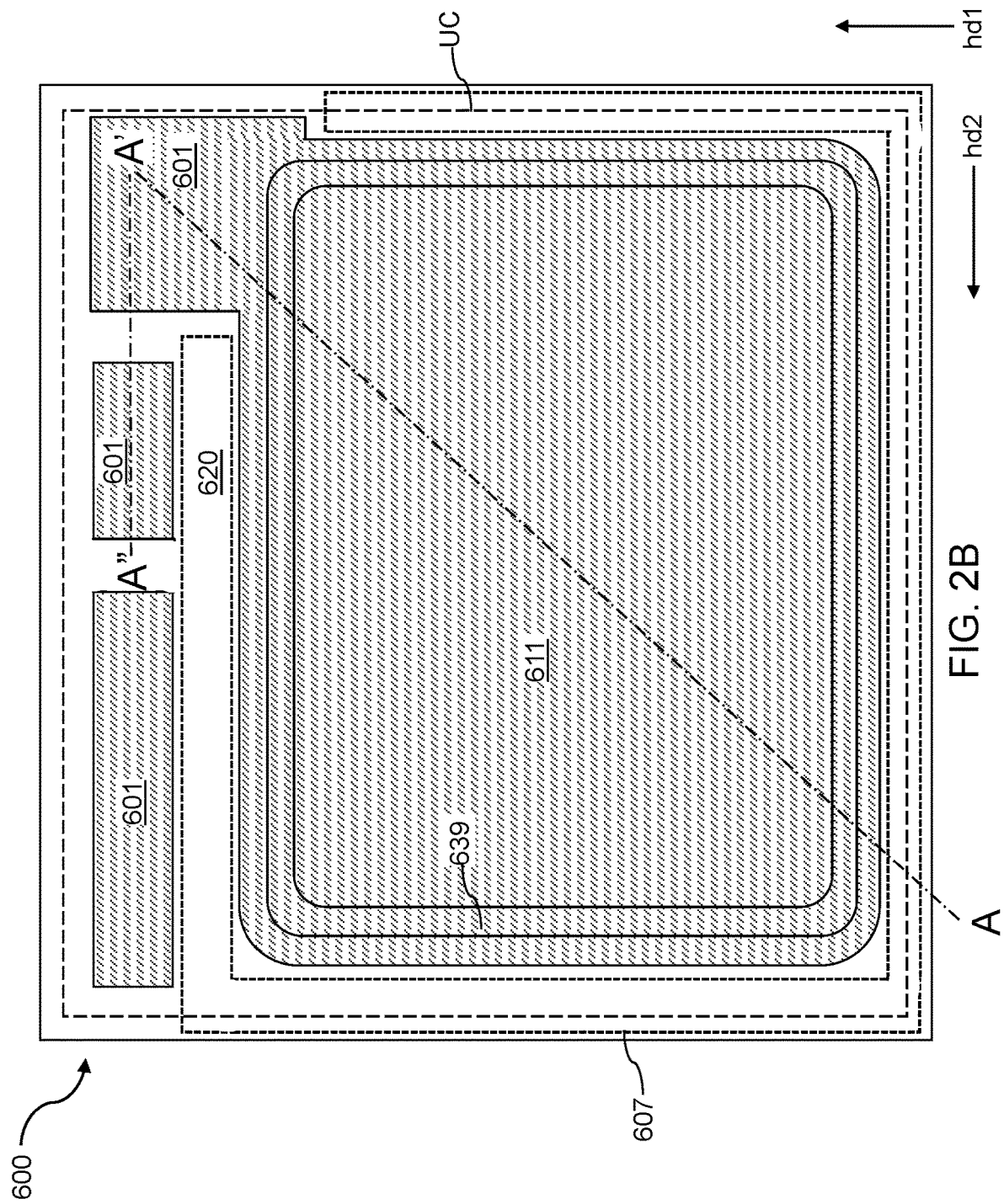
FIG. 2B is a plan view of the first exemplary structure of FIG. 2A. The hinged vertical plane A-A'-A" is the plane of the vertical cross-sectional view of FIG. 2A, which connects the vertical axes A, A', and A" of FIG. 2A.

Referring to FIGS. 2A and 2B, a region for a forming subpixel in a first exemplary structure 495 is illustrated. The region illustrated in FIGS. 2A and 2B corresponds to a region of a single subpixel within a pixel (900 in FIGS. 1A and 1B) in a pixel array region. The first exemplary structure includes a semiconductor substrate 500, which includes a substrate semiconductor layer 601 and various front-side device components formed therein.

Each subpixel may be formed on, or in, the substrate semiconductor layer 601, which has a front surface 609 and a back surface 610. The substrate semiconductor layer 601 includes a semiconductor material such as silicon, germanium, a silicon-germanium alloy, a compound semiconductor material, or any other semiconductor material having a band gap that that does not exceed the energy of the photons to be detected. The material within the substrate semiconductor layer 601 may be selected based on the energy range of the photons to be detected by the subpixel. In one embodiment, the substrate semiconductor layer 601 may include single crystalline silicon. A commercially available single crystalline semiconductor substrate may be used for the semiconductor substrate 500. The semiconductor substrate 500 as provided at this processing step may have a sufficiently high thickness to be able to withstand standard complementary metal-oxide-semiconductor (CMOS) processing steps. For example, the thickness of the semiconductor substrate 500 may be in a range from 200 microns to 1 mm, although lesser and greater thicknesses may also be used.

A top portion of the substrate semiconductor layer 601 may be suitably doped to have a first conductivity type, which may be p-type or n-type. The top portion of the substrate semiconductor layer 601 is a portion of the substrate semiconductor layer 601 that is employed to form various front-side device components thereupon, and remains in a final device structure after a bottom portion of the substrate semiconductor layer 601 is subsequently removed by substrate thinning. For example, an epitaxial semiconductor deposition process may be performed to form a single crystalline epitaxial semiconductor material layer at the top portion of the substrate semiconductor layer 601 such that the atomic concentration of the dopants of the first conductivity type is in a range from $1.0 \times 10^{13}/\text{cm}^3$ to $1.0 \times 10^{16}/\text{cm}^3$, although lesser and greater atomic concentrations may also be used. The thickness of the single crystalline epitaxial semiconductor material layer may be in a range from 1 micron to 10 microns, although lesser and greater thicknesses may also be used.

A doped well structure 607 may be formed by ion implantation of dopants of the first conductivity type around a region in which a p-n junction of a photodetector is to be subsequently formed. The doped well structure 607 may laterally surround the p-n junction region of the photodetector with a lateral opening in a segment at which a floating diffusion regions (608 in FIG. 4B) is to be subsequently formed. The atomic concentration of dopants of the first conductivity type in the doped well structure 607 may be in a range from $1.0 \times 10^{15}/\text{cm}^3$ to $1.0 \times 10^{18}/\text{cm}^3$, although lesser and greater atomic concentrations may also be used.

Shallow trench isolation structures 620 may be formed to provide device isolation between and from various semiconductor devices that may be subsequently formed. One of the shallow trench isolation structures 620 may be formed in an upper portion of the doped well structure 607. Shallow trench isolation structures 620 may be formed to provide electrical isolation between and from the various components within the subpixel.

Dopants of a second conductivity type may be implanted through the front surface 609 of the semiconductor substrate 500 using at least one masked ion implantation process. The second conductivity type is the opposite of the first conductivity type, which may be p-type or n-type. For example, if the first conductivity type is p-type, the second conductivity type is n-type, and vice versa. Various doped regions having a doping of the second conductivity type may be formed by the at least one masked ion implantation process. With reference to FIG. 2A, a second-conductivity-type photodiode layer 602 may be formed underneath the front surface 609 of the semiconductor substrate 500 such that a periphery of the second-conductivity-type photodiode layer 602 overlaps with an edge of subsequently formed transfer gate electrodes 605 in a plan view. The lateral extent of the second-conductivity-type photodiode layer 602 may be limited to one side of a transfer gate electrode to be subsequently formed. Thus, at least one edge of the second-conductivity-type photodiode layer 602 may be laterally spaced from the shallow trench isolation structures 620 by a region in which a transfer gate electrode and a floating diffusion region may be subsequently formed.

A buried second-conductivity-type photodiode layer 606 may be formed underneath the second-conductivity-type photodiode layer 602 at the depth of the bottom portions of the doped well structure 607 by implanting dopants of the second conductivity type with a higher implantation energy than during the implantation process that forms the second-conductivity-type photodiode layer 602. The buried second-conductivity-type photodiode layer 606 may be laterally offset inward from the doped well structure 607.

The top portion of the buried second-conductivity-type photodiode layer 606 may be adjoined to the bottom portion of the second-conductivity-type photodiode layer 602 within each subpixel. The area of the second-conductivity-type photodiode layer 602 may be located entirely within the area of the underlying buried second-conductivity-type photodiode layer 606 in each subpixel. In one embodiment, the buried second-conductivity-type photodiode layer 606 may include multiple sub-layers such as an upper second-conductivity-type photodiode sub-layer 606A and a lower second-conductivity-type photodiode sub-layer 606B. The multiple sub-layers of the buried second-conductivity-type photodiode layer 606 may be formed by multiple ion implantation processes that implant dopants of the second conductivity type at different depths within the semiconductor substrate 500.

In one embodiment, the depth of the top surface of the buried second-conductivity-type photodiode layer 606 may be in a range from 400 nm to 1,500 nm, although lesser and greater depths may also be used. In one embodiment, the depth of the bottom surface of the buried second-conductivity-type photodiode layer 606 may be in a range from 800 nm to 2,500 nm, although lesser and greater depths may also be used.

The unimplanted portion (i.e., element 611) of the substrate semiconductor layer 601 that overlies the buried second-conductivity-type photodiode layer 606 may have a doping of the first conductivity type, and may be subsequently used as a body region of a transfer transistor. As such, the unimplanted portion of the substrate semiconductor layer 601 that overlies the buried second-conductivity-type photodiode layer 606 is herein referred to as a transfer transistor body region 611. In one embodiment, the buried second-conductivity-type photodiode layer 606 may have the same lateral extent as a transfer transistor 630 that may be subsequently formed, and may coincide with the portion of the shallow trench isolation structure 620 that encircles the combination of the second-conductivity-type photodiode layer 602 and the transfer transistor body region 611. The transfer transistor body region 611 is a portion of the substrate semiconductor layer 601.

Generally, a semiconductor substrate 500 including a substrate semiconductor layer 601 having a doping of a first conductivity type is provided, and a second-conductivity-type photodiode layer 602 may be formed in the substrate semiconductor layer 601 by implanting dopants of the second conductivity type. The second-conductivity-type photodiode layer 602 forms a p-n junction with the substrate semiconductor layer 601 in a p-n junction area, which is the photon detection area of the photodetector.

The illustrated portion within the area of FIG. 2B of the first exemplary structure may constitute a unit cell ("UC"). Multiple instances of the unit cell UC may be repeated in a two-dimensional periodic array to provide the array 1000 of pixels illustrated in FIGS. 1A and 1B.

Referring back to FIGS. 2A and 2B and according to an aspect of the present disclosure, a photoresist layer (not shown) may be applied over the top surface of the semiconductor substrate 500, and may be lithographically patterned to form discrete openings therethrough. The pattern of the openings in the photoresist layer includes at least one opening that is arranged around a respective p-n junction area, which is the area of the interface between the transfer transistor body region 611 and the combination of the second-conductivity-type photodiode layer 602 and the buried second-conductivity-type photodiode layer 606. The photoresist layer may have a single opening that defines a p-n junction area, or may have a plurality of openings that defines a plurality of p-n junction areas.

An anisotropic etch process may be performed to transfer the pattern of the openings in the photoresist layer into an upper portion of the substrate semiconductor layer 601. At least one trench 639 may be formed within each unit cell UC of the first exemplary structure. Each trench 639 vertically extends from a front-side horizontal surface (i.e., the front surface 609) of the substrate semiconductor layer 601 toward a backside horizontal surface 610 of the substrate semiconductor layer 601. Each trench 639 may be formed adjacent to a respective second-conductivity-type photodiode layer 602.

In one embodiment, each trench 639 has a greater depth than a vertical thickness of floating diffusion regions (608 in FIG. 4B) to be subsequently formed. The depth of the bottom surface of each trench 639 is greater than the p-n junction between the top surface of the second-conductivity-type photodiode layer 602 and the transfer transistor body region 611. The depth of the bottom surface of each trench 639 may be the same as, greater than, or less than, the depth of the buried second-conductivity-type photodiode layer 606. For example, the depth of the bottom surface of each trench 639 may be in a range from 600 nm to 3,000 nm, such as from 800 nm to 2,500 nm, although lesser and greater depths may also be used. Generally, the depth of the bottom surface of each trench 639 may be selected such that a transfer gate electrode 605 to be subsequently formed therein may provide effective channel control between the p-n junction and the floating diffusion region to be subsequently formed. In one embodiment, the depth of the bottom surface of each trench 639 may be greater than the depth of the buried second-conductivity-type photodiode layer 606. The depth of the bottom surface of each trench 639 may be selected such that the photoresist layer is not completely consumed during the anisotropic etch process. In other words, the maximum for the depth of the bottom surface of each trench 639 may be limited by the ability to anisotropically etch the unmasked portions of the substrate semiconductor layer 601 without collaterally damaging masked portions of the substrate semiconductor layer 601 due to photoresist material consumption.

In one embodiment, each trench 639 may be formed as a moat trench that laterally surrounds a respective second-conductivity-type photodiode layer 602. As shown in FIGS. 2A and 2B, a moat trench refers to a trench having an inner periphery that encircles a region located inside the trench. Thus, the inner periphery of a moat trench may be laterally spaced from the outer periphery of the moat trench by the lateral width of the moat trench. The width of each trench 639, i.e., the lateral distance between an inner sidewall and an outer sidewall of the respective trench 639, may be in a range from 100 nm to 600 nm, although lesser and greater widths may also be used. In one embodiment, each trench 639 may include sidewalls that vertically extend straight from the front surface 609 of the semiconductor substrate 500 to the bottom surface of the respective trench 639. In an embodiment, the trenches 639 may be free of any stepped surfaces. The photoresist layer may be subsequently removed, for example, by ashing. In embodiments in which a doped well structure 607 is present within each unit cell UC, the doped well structure 607 may laterally surround a trench 639 without laterally enclosing the trench 639. A gap in the doped well structure 607 may be located in a region that is proximal to the region in which a floating diffusion region is to be subsequently formed.

Figure 3A:
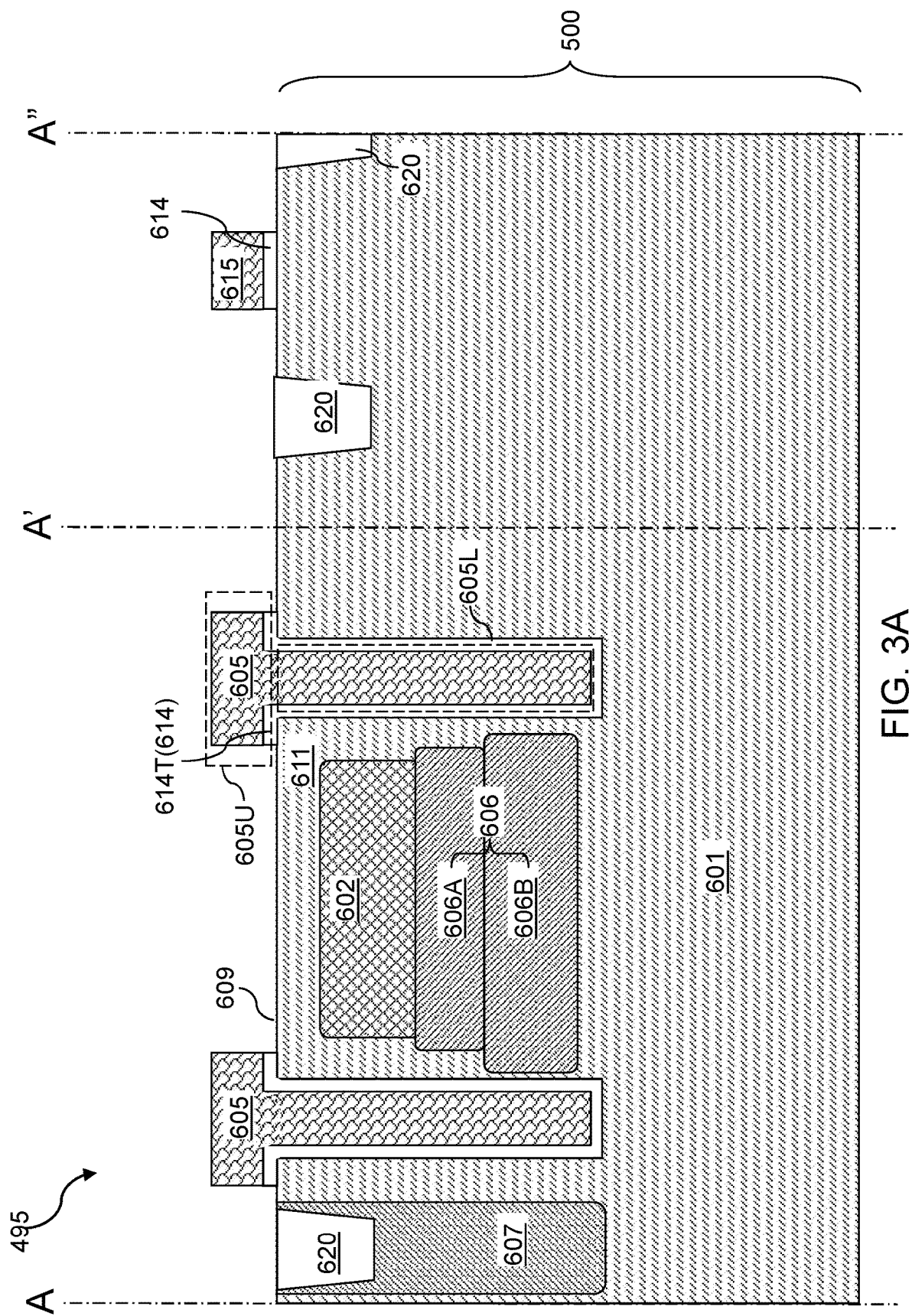
FIG. 3A is a vertical cross-sectional view of the first exemplary structure at a processing step after formation of gate dielectrics and gate electrodes according to the first embodiment of the present disclosure.
Figure 3B:
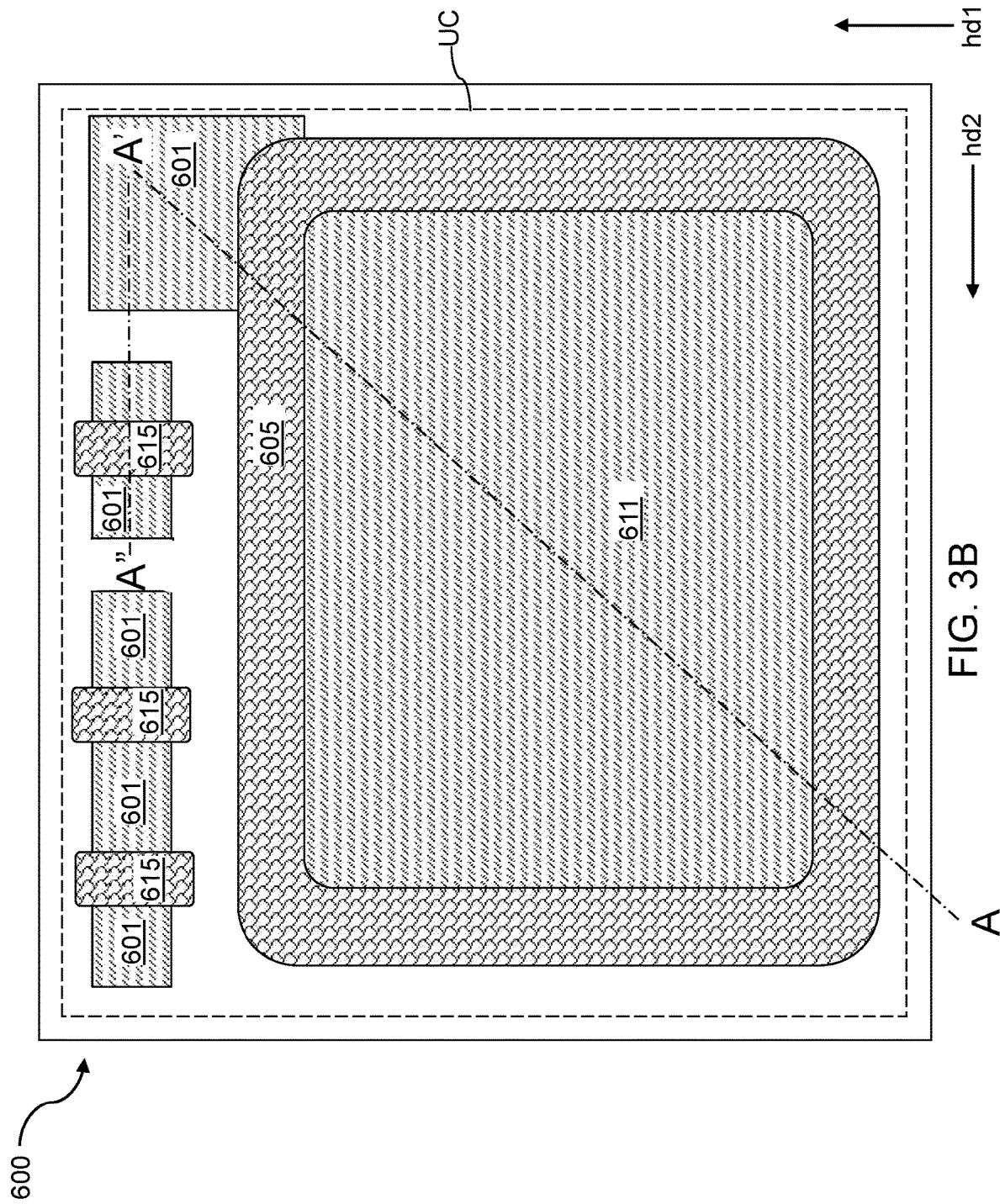
FIG. 3B is a plan view of the first exemplary structure of FIG. 3A. The hinged vertical plane A-A'-A" is the plane of the vertical cross-sectional view of FIG. 3A, which connects the vertical axes A, A', and A" of FIG. 2A.

Referring to FIGS. 3A and 3B, a gate dielectric layer may be formed on the bottom surface and the sidewalls of each trench 639 and on the front-side horizontal surface of the substrate semiconductor layer 601 (i.e., the front surface 609 of the semiconductor substrate 500). The gate dielectric layer may include any gate dielectric material known in the art. For example, the gate dielectric layer may include silicon oxide, silicon oxynitride, and/or a dielectric metal oxide (such as aluminum oxide and/or hafnium oxide). Other suitable dielectric materials are within the contemplated scope of disclosure. The gate dielectric layer may be formed as a conformal layer by thermal oxidation of physically exposed surface portions of the semiconductor material of the semiconductor substrate 500 and/or by conformal deposition of a dielectric material layer (such as chemical vapor deposition or atomic layer deposition). The thickness of the gate dielectric layer may be in a range from 3 nm to 12 nm, although lesser and greater thicknesses may also be used.

A gate electrode material layer may be subsequently formed on the gate dielectric layer in, and over, each trench 639. The gate electrode material layer includes at least one gate electrode material, which may include a heavily doped semiconductor material (such as doped polysilicon) and/or a metallic gate material such as a metallic nitride (such as titanium nitride), an elemental metal, or an intermetallic alloy. The thickness of the gate electrode material layer may be selected such that the entire volume of the trench 639 in each unit cell UC is filled with the combination of the gate dielectric layer and the gate electrode material layer.

A photoresist layer (not shown) may be applied over the gate electrode material layer, and may be lithographically patterned to cover areas in which gate electrodes are to be subsequently formed. The areas covered by the patterned portions of photoresist layer include the entire area of each trench 639. In one embodiment, each trench 639 in a unit cell UC may be a moat trench having an inner sidewall and an outer sidewall, and the area covered by the photoresist layer may include the entire area of the moat trench. Further, the areas covered by the patterned portions of the photoresist layer may include areas in which gate electrodes of field effect transistors of sensing circuits are to be subsequently formed.

An anisotropic etch may be performed to transfer the pattern in the photoresist layer through the gate electrode material layer and the gate dielectric layer. The patterned portions of the gate electrode layer comprise gate electrodes (605, 615). The gate electrodes (605, 615) include transfer gate electrodes 605 that are formed within, or over, a respective one of the trenches 639, and planar gate electrodes 615 that may be formed within regions of the sensing circuits. The gate dielectric layer may be subsequently patterned using an anisotropic or isotropic etch process to form gate dielectrics 614, which include transfer gate dielectrics 614T that are formed underneath a respective one of the transfer gate electrodes 605 and include planar gate dielectrics that are gate dielectrics of the field effect transistors of the sensing circuits. Generally, the transfer gate dielectrics 614T may be patterned out of the gate dielectric layer after patterning the gate electrode material layer into the various gate electrodes (605, 615).

In one embodiment, each transfer gate electrode 605 may include a lower transfer gate electrode portion 605L that may be formed within the substrate semiconductor layer 601 and located adjacent to the p-n junction of the photodetector. The lower transfer gate electrode portion 605L may laterally surround the p-n junction. The lower transfer gate electrode portion is located within the trench. In one embodiment, each lower transfer gate electrode portion 605L may be located within a respective moat trench that laterally surrounds a respective second-conductivity-type photodiode layer 602. Further, each transfer gate electrode 605 comprises an upper transfer gate electrode portion 605U that is formed over the substrate semiconductor layer 601 and has a greater lateral extent than the lower transfer gate electrode portion 605L. Specifically, peripheral portions of the upper transfer gate electrode portion 605U may be located outside the area of an underlying trench and may overlie the front surface 609 of the semiconductor substrate 500. In one embodiment, each transfer gate electrode 605 may be topologically homeomorphic to a torus, i.e., may be continuously stretched into the shape of a torus without forming a new hole or destroying an existing hole.

Figure 4A:
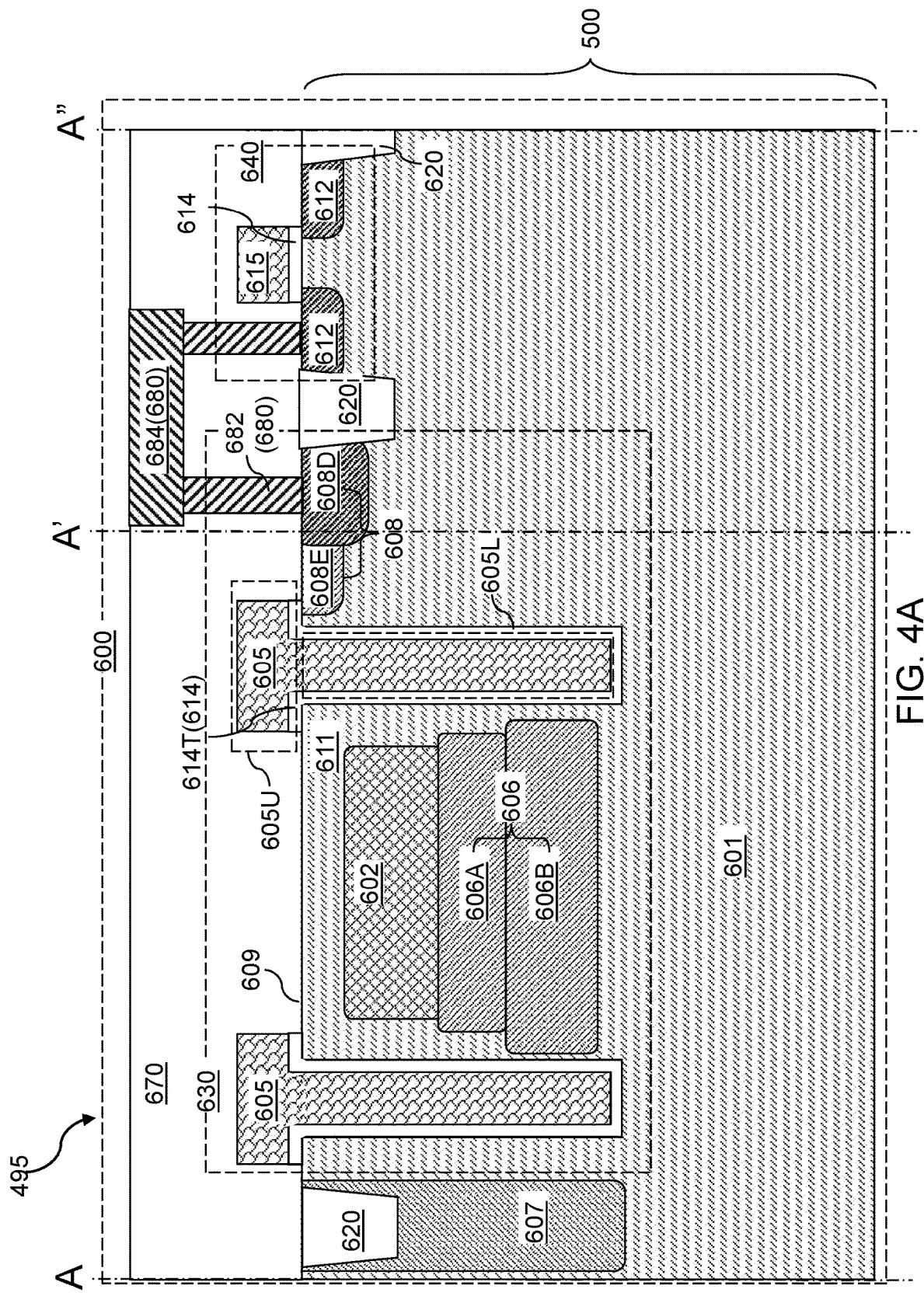
FIG. 4A is a vertical cross-sectional view of the first exemplary structure at a processing step after formation of field effect transistors according to the first embodiment of the present disclosure.
Figure 4B:
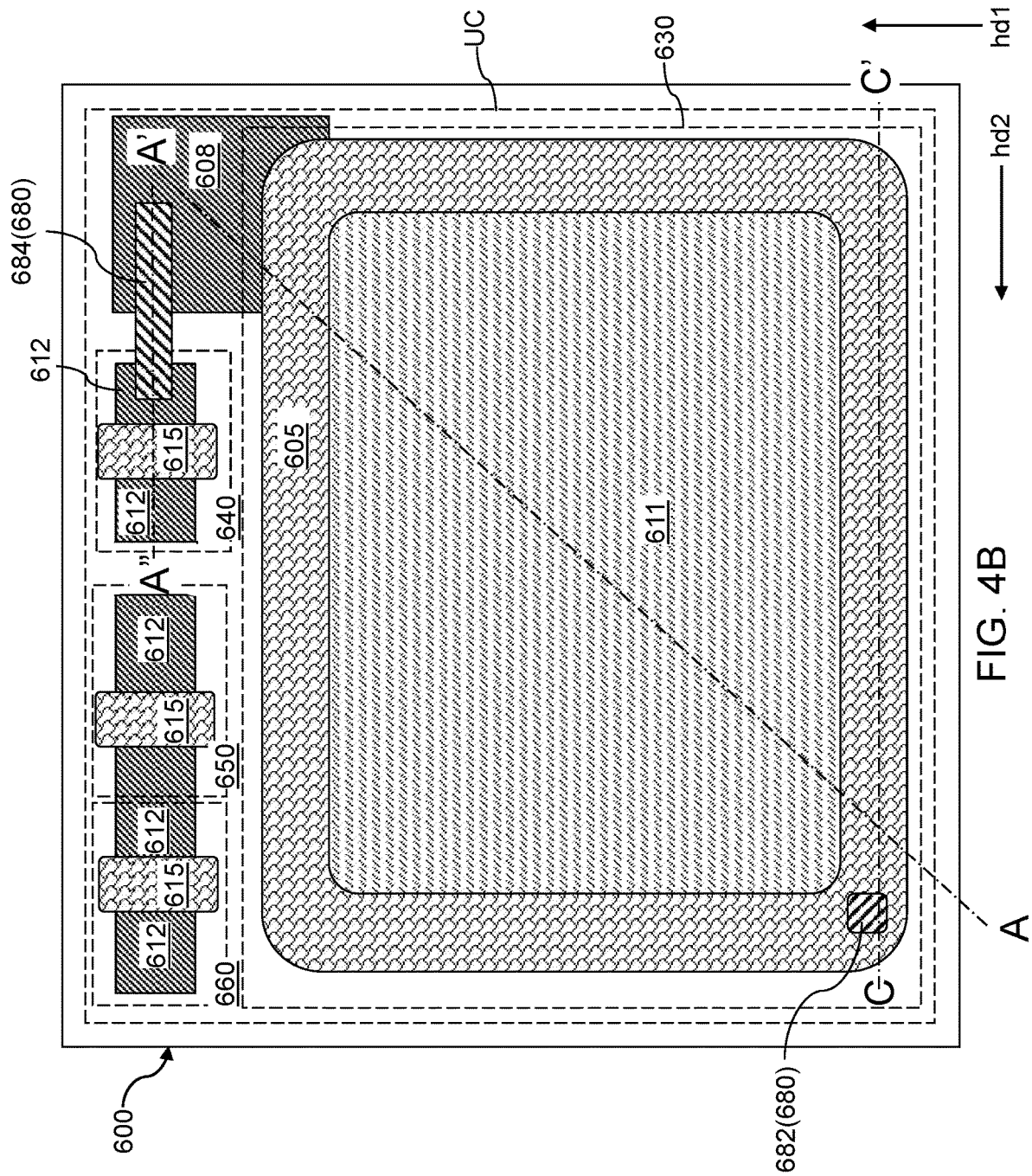
FIG. 4B is a plan view of the first exemplary structure of FIG. 4A. The hinged vertical plane A-A'-A" is the plane of the vertical cross-sectional view of FIG. 2A, which connects the vertical axes A, A', and A" of FIG. 2A.
Figure 4C:
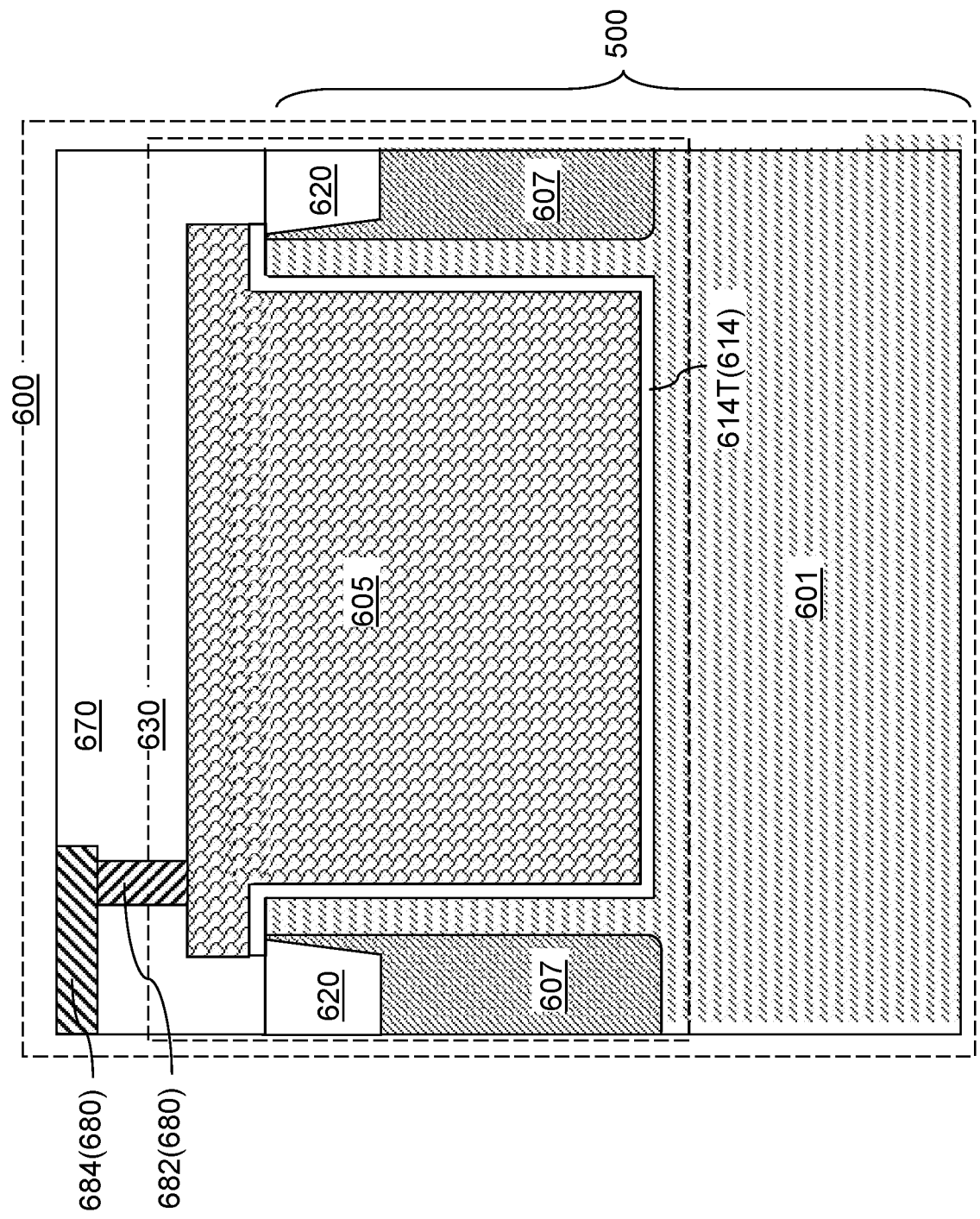
FIG. 4C is a vertical cross-sectional view of the first exemplary structure of FIGS. 4A and 4B along the vertical plane C-C' of FIG. 4B.

Referring to FIGS. 4A-4C, masked ion implantation processes may be performed to form various active regions (608, 612), which include floating diffusion regions 608 and active regions 612 of field effect transistors of sensing circuits. The various gate electrodes (605, 615) may be used as self-aligned masking structures in addition to patterned implantation mask layers (such as lithographically patterned photoresist layers) during the masked ion implantation processes.

Each floating diffusion region 608 may be formed within a portion of the substrate semiconductor layer 601 that is adjacent to a respective transfer gate electrode 605. Each transfer gate electrode 605 is located between the second-conductivity-type photodiode layer 602 and the floating diffusion region 608 within a respective unit cell UC. In one embodiment, the floating diffusion region 608 in each unit cell UC may be formed by implanting dopants of the second conductivity type into a portion of the substrate semiconductor layer 601 that underlies a peripheral region of an upper transfer gate electrode portion 605U located above a trench 639. In one embodiment, each floating diffusion region 608 may include a floating diffusion extension region 608E that underlies a peripheral region of an upper transfer gate electrode portion 605U and a deep floating diffusion region 608D that is laterally spaced from the trench 639 and adjoined to a sidewall of the floating diffusion extension region 608E. Generally, a peripheral region of the upper transfer gate electrode portion 605U may have an area overlap with a peripheral region of the floating diffusion region 608 in a plan view, which is a view along a direction that is perpendicular to the front-side horizontal surface of the substrate semiconductor layer 601 (i.e., the front surface 609 of the semiconductor substrate 500).

In one embodiment, the trench 639 in each unit cell UC may have a greater depth than the vertical thickness of the floating diffusion region 608 in the unit cell UC. For example, the floating diffusion region 608 may have a maximum depth in a range from 100 nm to 400 nm, although lesser and greater maximum depths may also be used. The transfer gate electrode 605 in each unit cell UC includes a lower transfer gate electrode portion 605L that is formed within the substrate semiconductor layer 601 and located between the second-conductivity-type photodiode layer 602 and the floating diffusion region 608. In one embodiment, the lower transfer gate electrode portion 605L comprises a planar bottom surface having an inner periphery and an outer periphery. The inner periphery and the outer periphery of the planar bottom surface laterally surround the second-conductivity-type photodiode layer 602 at a same depth from a front-side horizontal surface of the substrate semiconductor layer 601. Current flow between the second-conductivity-type photodiode layer 602 and the floating diffusion region 608 within each unit cell UC may be controlled by the transfer gate electrode 605 in the unit cell UC.

A sensing circuit may be formed within each unit cell UC. The sensing circuit may be configured to measure the amount of electrical charges that are transferred from the p-n junction between the transfer transistor body region 611 and the second-conductivity-type photodiode layer 602 through a semiconductor channel around the transfer gate electrode 605 and into the floating diffusion region 608.

A photodetector circuit may be formed on the semiconductor substrate 500 within each area of a subpixel. Each photodetector circuit includes a respective set of front side sensor components 600. Front side sensor components 600 refer to all components of the image sensor that may be formed on the front surface 609 of a semiconductor substrate 500, or may be formed within the substrate semiconductor layer 601. Each photodetector circuit may include a photodetector (comprising a transfer transistor 630) and a sensing circuit (640, 650, 660) that includes a reset transistor 640, a source follower transistor 650, and a select transistor 660.

Interconnect-level dielectric layers 670 may be formed over the front surface 609 of the semiconductor substrate 500, and metal interconnect structures 680 connecting the various nodes of the transistors (630, 640, 650, 660) may be formed within each subpixel. The interconnect-level dielectric layers 670 may include a respective dielectric material such as undoped silicate glass, a doped silicate glass, organosilicate glass, a porous dielectric material, or combinations thereof. Dielectric liners including various dielectric materials (such as silicon nitride, silicon oxynitride, silicon oxide carbide, and/or dielectric metal oxides) may be optionally used in the interconnect-level dielectric layers 670. The metal interconnect structures 680 may include various metal via structures 682 and various metal line structures 684. For example, each of the floating diffusion regions 608 may be connected to the gate electrode 615 of a respective source follower transistor 650 by a subset of the metal interconnect structures 680. A photodetector may comprise a transfer transistor 630, and may be connected to a sense circuit including additional transistors (640, 650, 660).

Each subpixel may include a respective photodetector circuit, which includes a subset of the front side sensor components 600 that may be located within the area of a subpixel, which may be the area of a unit cell UC. A set of subpixels may be used for a pixel, and an array 1000 of pixels may be arranged as illustrated in FIG. 1A or in FIG. 1B, or in any other suitable array configurations to provide an image sensor. Each subpixel may comprise a unit cell UC, which may be repeated along at least one horizontal direction to provide front side sensor components 600 for a single pixel, which may include a single subpixel, two subpixels, or three or more subpixels. In one embodiment, multiple instances of the unit cell UC may be repeated along at least one horizontal direction. For example, the unit cell UC may be repeated as a two-dimensional array of unit cells UC that are replicated with a first periodicity along a first horizontal direction hd1 and with a second periodicity along a second horizontal direction hd2. As discussed above with reference to FIGS. 1A and 1B, the two-dimensional array may be a rectangular array or a hexagonal array. As such, the second horizontal direction hd2 may, or may not, be perpendicular to the first horizontal direction hd1.

Figure 5:
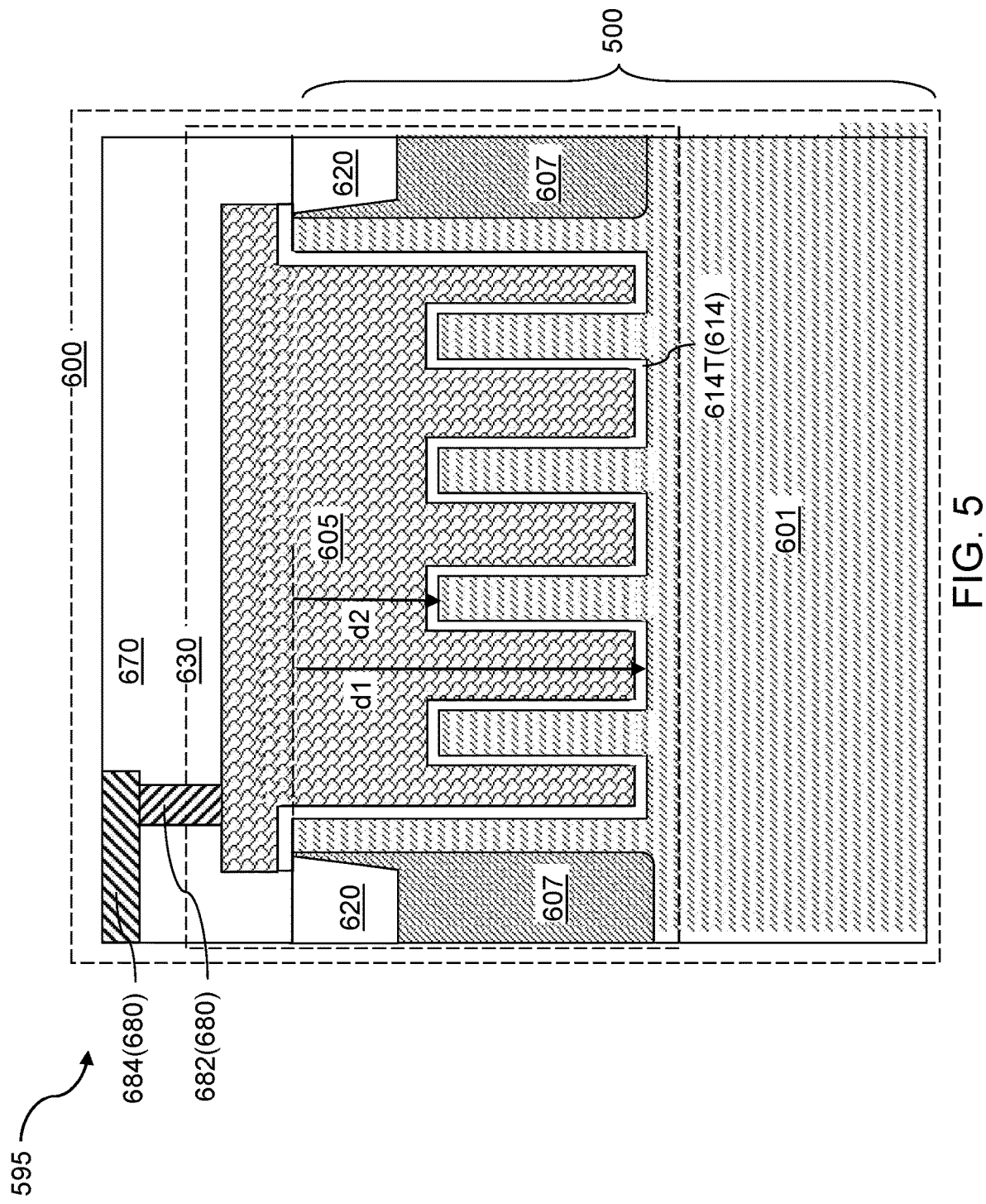
FIG. 5 is a vertical cross-sectional view of a second exemplary structure at the processing steps of FIGS. 4A-4C according to a second embodiment of the present disclosure.

Referring to FIG. 5, a second exemplary structure 595 according to a second embodiment of the present disclosure may be derived from the first exemplary structure illustrated at the processing steps of FIGS. 4A-4C by introducing vertical steps to the bottom surface of each trench 639 in the first exemplary structure. Generally, the processing steps for forming the second exemplary structure may be the same as the processing steps for forming the first exemplary structure except that the processing steps for forming the trenches 639 may be modified to form first segments of each trench 639 with a first depth d1 and second segments of each trench 639 with a second depth d2. Two lithographic patterning processes and two anisotropic etch processes may be used to form the trenches 639 of the second exemplary structure of FIG. 5. The first depth d1 may be in a range from 600 nm to 3,000 nm, such as from 800 nm to 2,500 nm, although lesser and greater depths may also be used. The second depth d2 may be in a range from 15% to 85%, such as from 30% to 70%, of the first depth d1, although lesser and greater ranges may also be used. In one embodiment, the first segments having the first depth d1 and the second segments having the second depth d2 may alternate along the lengthwise horizontal direction of each trench 639. A castellated bottom surface (i.e., having a pattern of indentations to resemble a castle with battlements) may be provided in each trench 639. Each bottom surface segment at the first depth d1 may be connected to adjacent bottom surface segments at the second depth d2 by substantially vertical or vertical interconnecting sidewalls of the trench 639. In such an embodiment, the lower transfer gate electrode portion 605L may comprise a castellated bottom region having multiple bottom surface segments that are adjoined to one another by vertical sidewalls of the lower transfer gate electrode portion 605L. Each segment of the trench 639 with the second depth d2 may provide a shorter current path than segments of the trench 639 having the first depth d1 during a charge transfer operation from the photodiode region to the floating diffusion region 608.

Figure 6A:
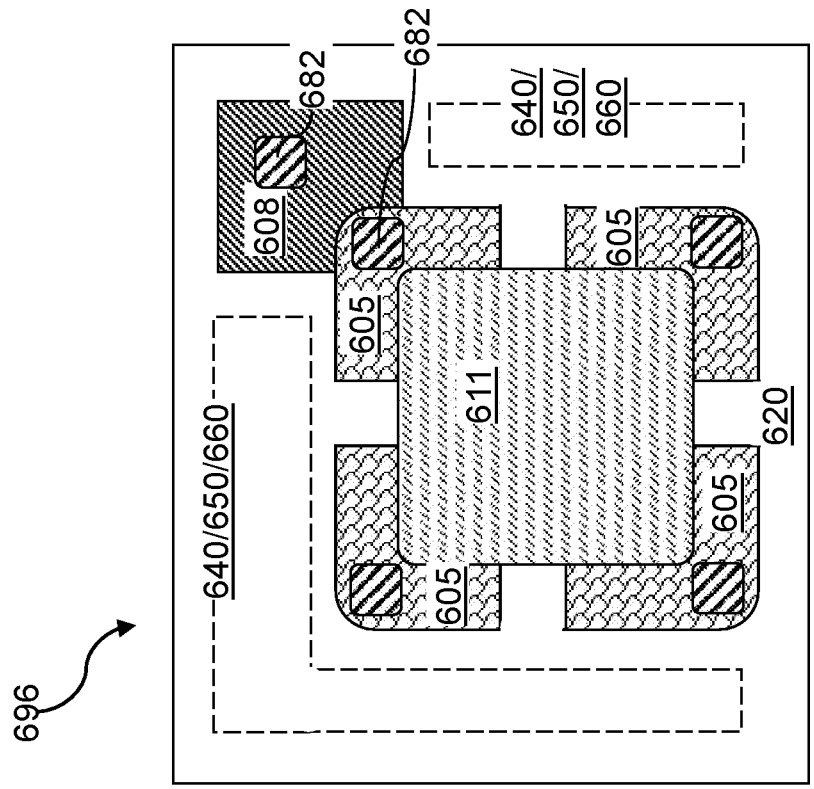
FIG. 6A is a plan view of a first configuration of a third exemplary structure after formation of field effect transistors according to the third embodiment of the present disclosure.
Figure 6B:
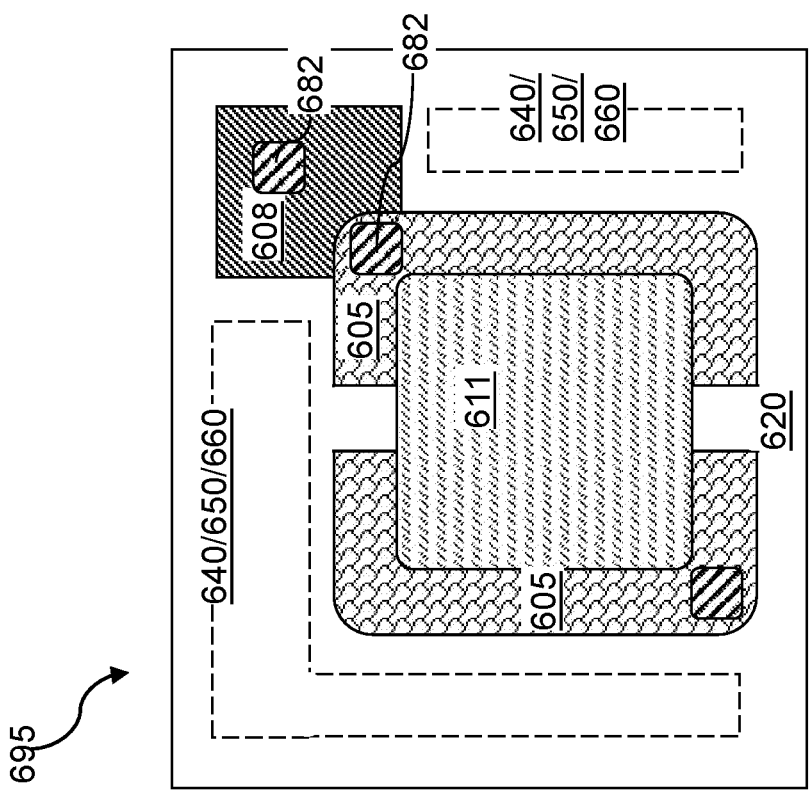
FIG. 6B is a plan view of a second configuration of the third exemplary structure after formation of field effect transistors according to the third embodiment of the present disclosure.

Referring to FIGS. 6A and 6B, a first configuration 695 and a second configuration 696 of a third exemplary structure according to a third embodiment of the present disclosure are shown, respectively. The third exemplary structure may be derived from the first exemplary structure by forming a plurality of trenches 639 along a periphery of the second-conductivity-type photodiode layer 602 in each unit cell UC. Further, a plurality of transfer gate electrodes 605 may be formed in the third exemplary structure in lieu of a single transfer gate electrode 605 in the first exemplary structure. Each transfer gate electrode 605 may include a respective lower transfer gate electrode portion located within a respective trench 639. A metal via structure 682 may be formed on each of the transfer gate electrodes 605 to electrically bias the transfer gate electrodes 605. The transfer gate electrodes 605 within a same unit cell UC may be electrically connected to one another.

Generally, the third exemplary structure may be derived from the first exemplary structure by modifying the transfer gate electrode 605 of the first exemplary structure not to be topologically homeomorphic to a torus, and to be formed as multiple discrete portions. Thus, each third exemplary structure may include at least one additional transfer gate electrode 605 in addition to a transfer gate electrode 605 located within the substrate semiconductor layer 601. The transfer gate electrode 605 and the at least one additional transfer gate electrode 605 (i.e., a plurality of transfer gate electrodes 605) may be located around the periphery of the second-conductivity-type photodiode layer 602, and may be laterally spaced apart from one another. Shallow trench isolation structures 620 may be present between each neighboring pair of transfer gate electrodes 605.

Figure 7B:
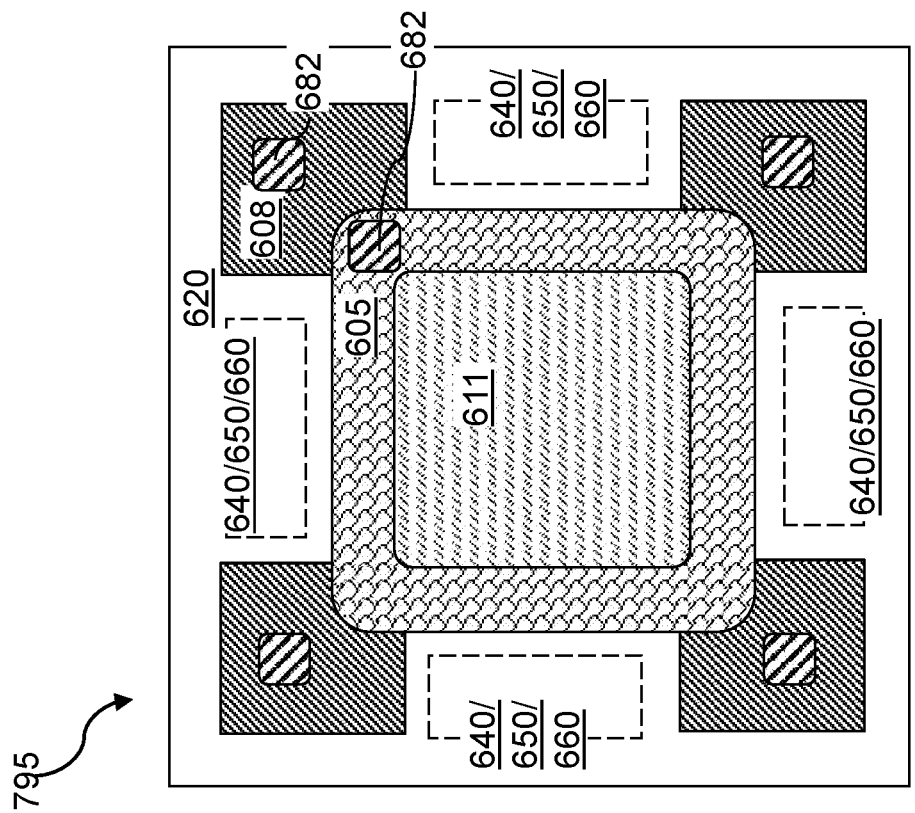
FIG. 7B is a plan view of a second configuration of the fourth exemplary structure after formation of field effect transistors according to the fourth embodiment of the present disclosure.
Figure 7A:
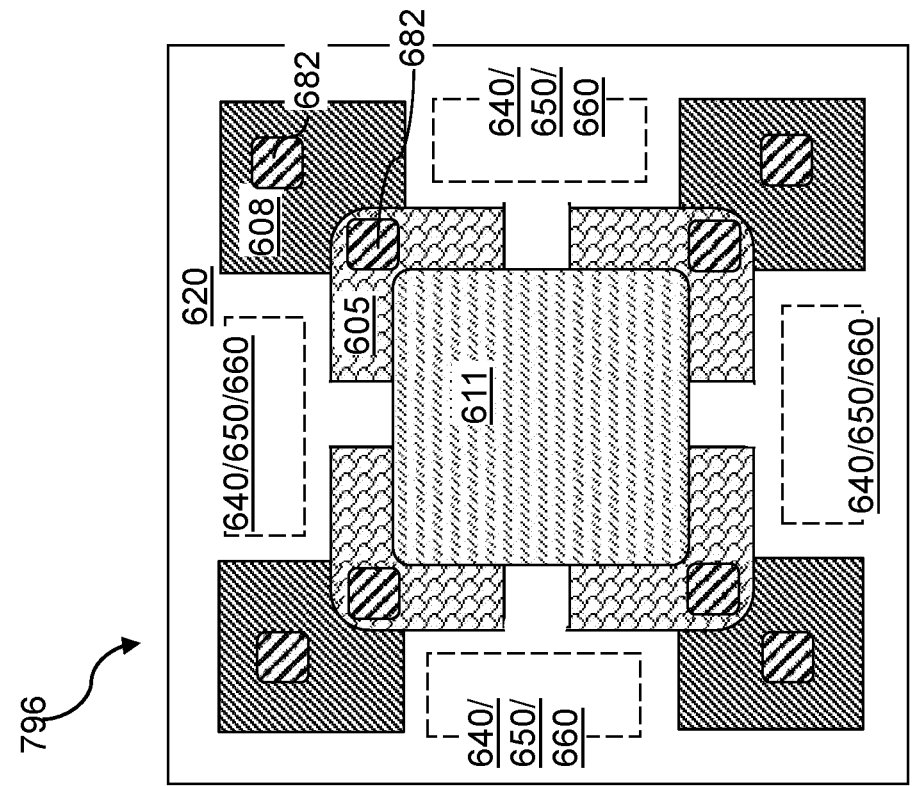
FIG. 7A is a plan view of a first configuration of a fourth exemplary structure after formation of field effect transistors according to a fourth embodiment of the present disclosure.

Referring to FIGS. 7A and 7B, a first configuration 795 and a second configuration 796 of a fourth exemplary structure according to a fourth embodiment of the present disclosure are shown, respectively. A first configuration of the fourth exemplary structure may be derived from the first exemplary structure by forming a plurality of floating diffusion regions 608 and a trench 639 with a transfer gate electrode 605 that may be topologically homeomorphic to a torus (as shown in FIG. 7A) along a periphery of the second-conductivity-type photodiode layer 602 in each unit cell UC. A second configuration of the fourth exemplary structure may be derived from the first exemplary structure by forming a plurality of floating diffusion regions 608 and a plurality of trenches 639 (as shown in FIG. 7B) along a periphery of the second-conductivity-type photodiode layer 602 in each unit cell UC. Each of the plurality of floating diffusion regions 608 may be laterally spaced from one another, and may be laterally spaced from the second-conductivity-type photodiode layer 602 by a respective one of the plurality of transfer gate electrodes 605.

Each of the plurality of transfer gate electrodes 605 may be located within the substrate semiconductor layer 601. In one embodiment, the plurality of transfer gate electrodes 605 (such as a transfer gate electrode 605a and at least one additional transfer gate electrode 605b, 605c, 605d) may be located within the substrate semiconductor layer 601 around a periphery of the second-conductivity-type photodiode layer 602, and are laterally spaced apart from one another. The plurality of floating diffusion regions 608 (such as a floating diffusion region 608a and at least one additional floating diffusion region 608b, 608c, 608d) may be laterally spaced from, and may laterally surround, the second-conductivity-type photodiode layer 602. Each of the plurality of transfer gate electrodes 605 (i.e., the transfer gate electrode 605a and at least one additional transfer gate electrode 605b, 605c, 605d) may be located between the second-conductivity-type photodiode layer 602 and a respective one of the plurality of floating diffusion regions 608 (i.e., the floating diffusion region 608a and at least one additional floating diffusion region 608b, 608c, 608d). In one embodiment, the plurality of floating diffusion regions 608 may be electrically connected (i.e., electrically shorted) to one another through a subset of the metal interconnect structures 680. Additionally or alternatively, the plurality of transfer gate electrodes 605 may be electrically connected to one another through another subset of the metal interconnect structures 680.

Figure 8A:
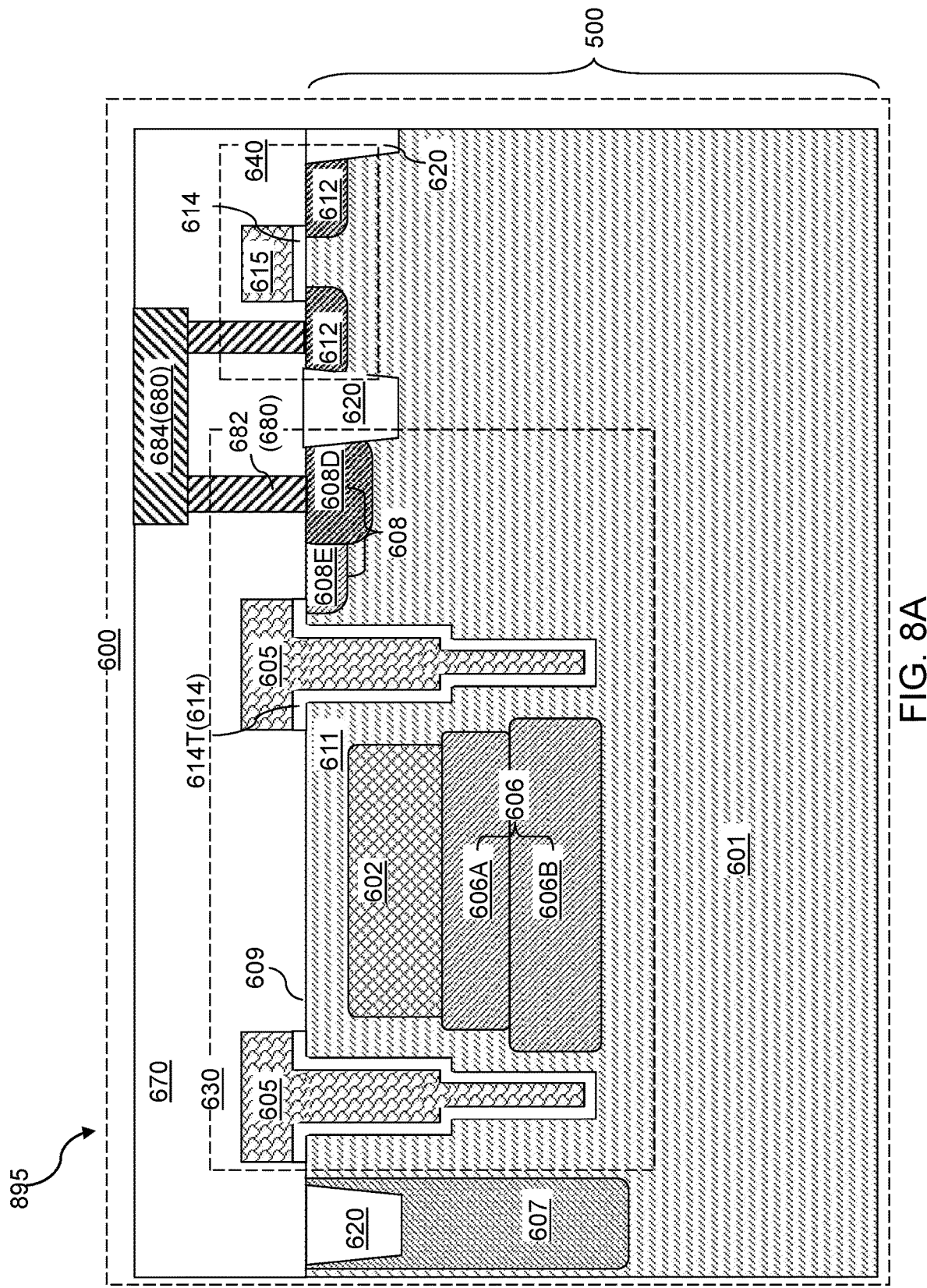
FIG. 8A is a vertical cross-sectional view of a first configuration of a fifth exemplary structure after formation of field effect transistors according to a fifth embodiment of the present disclosure.
Figure 8B:
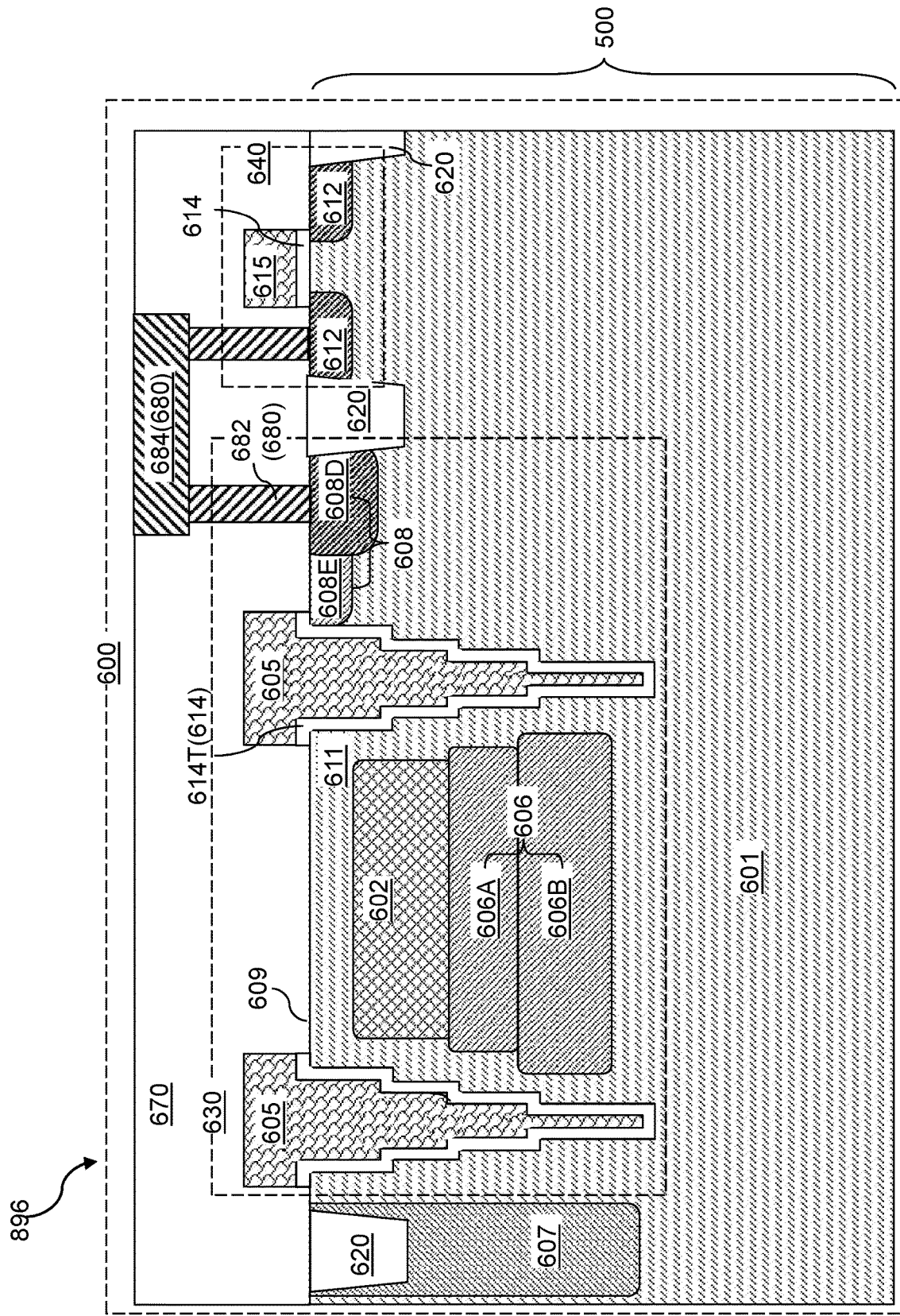
FIG. 8B is a vertical cross-sectional view of a second configuration of the fifth exemplary structure after formation of field effect transistors according to the fifth embodiment of the present disclosure.

Referring to FIGS. 8A and 8B, a first configuration 895 and a second configuration 896 of a fifth exemplary structure according to a fifth embodiment of the present disclosure are shown, respectively. The fifth exemplary structure may be derived from the first exemplary structure by forming at least one stepped sidewall during formation of the trenches 639. The stepped sidewalls of the trenches 639 may be formed, for example, by forming a narrow opening in a photoresist layer for each trench 639 to be subsequently formed, by performing a first anisotropic etch step that transfers the pattern of the narrow opening in the photoresist layer into an upper portion of the substrate semiconductor layer 601, by trimming the photoresist layer so that each narrow opening is converted into a wider opening, and by performing a second anisotropic etch process that transfers the pattern of the widened opening into the upper portion of the substrate semiconductor layer 601 while deepening pre-existing trenches in the substrate semiconductor layer 601. The total number of photoresist trimming processes may be the same as the number of levels at which horizontal steps are formed in the sidewalls of the trenches 639.

In the fifth exemplary structure, each lower transfer gate electrode portion 605L in a unit cell UC may have a vertical cross-sectional profile in which a width of the lower transfer gate electrode portion 605 decreases stepwise at least once with a vertical distance from a front-side horizontal top surface of the substrate semiconductor layer 601 (i.e., from the front surface 609 of the semiconductor substrate 500). FIG. 8A illustrates a configuration in which one photoresist trimming process and two anisotropic etch steps are used to form the trenches 639. FIG. 8B illustrates a configuration in which three photoresist trimming processes and four anisotropic etch processes are used to form the trenches 639. Generally, at least one photoresist trimming process and at least two anisotropic etch processes may be used to form trenches having at least one stepped sidewall and transfer gate electrodes 605 having sidewalls with at least one horizontal step connecting vertical sidewalls.

In another embodiment (not shown), the sidewalls of the trenches 639 may be formed with a taper angle in lieu of horizontal steps. In this embodiment, the etch chemistry of the anisotropic etch process that forms the trenches 639 may be selected such that a polymer coating is temporarily formed during the anisotropic etch process to facilitate formation of tapered sidewalls for the trenches 639.

Figure 9:
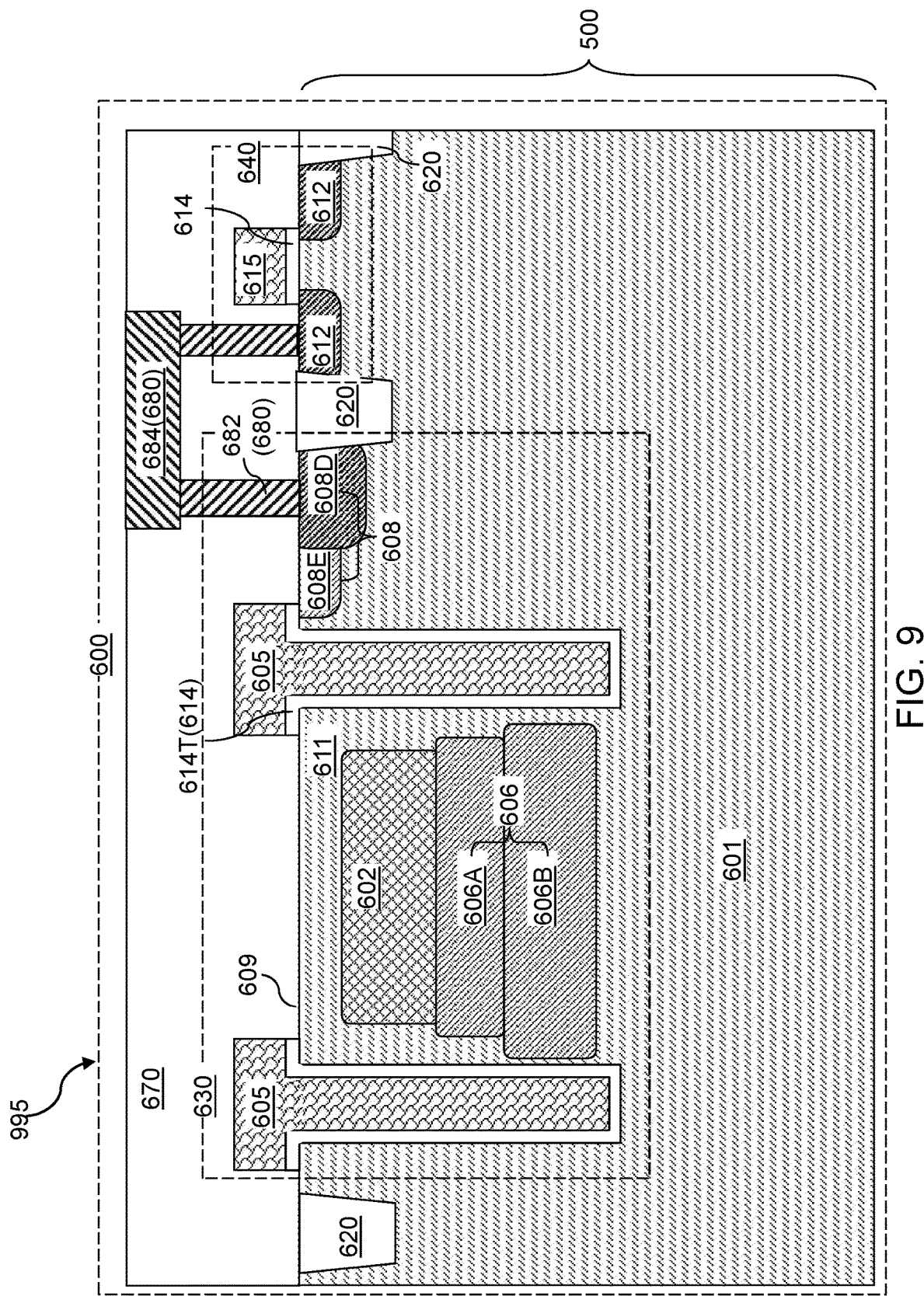
FIG. 9 is a vertical cross-sectional view of a sixth exemplary structure after formation of field effect transistors according to a sixth embodiment of the present disclosure.

Referring to FIG. 9, a sixth exemplary structure 995 according to a sixth embodiment of the present disclosure may be derived from any of the first through fifth exemplary structure of the present disclosure illustrated in FIGS. 8A and 8B by omitting formation of doped well structures 607.

Figure 10:
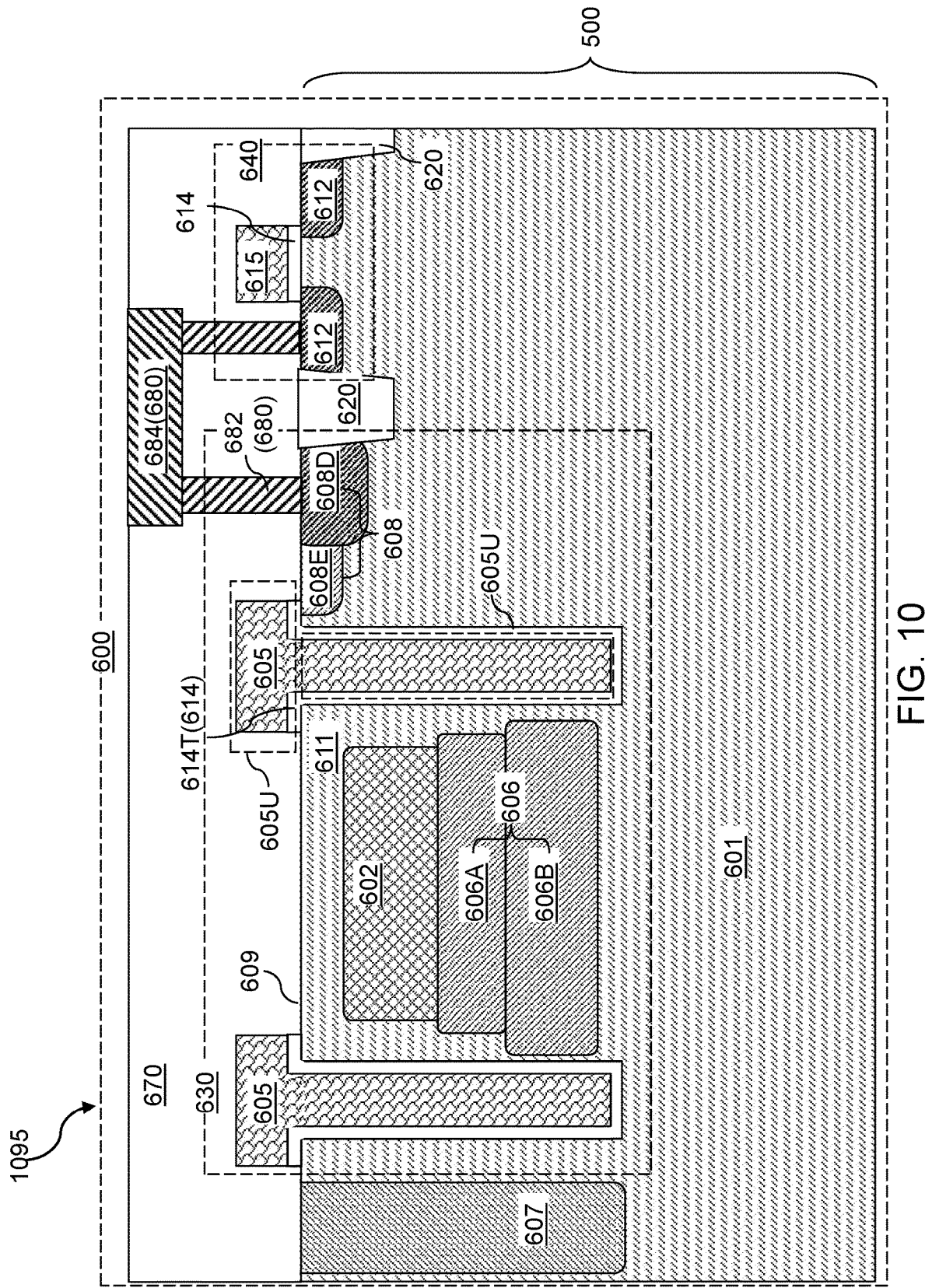
FIG. 10 is a vertical cross-sectional view of a seventh exemplary structure after formation of field effect transistors according to a seventh embodiment of the present disclosure.

Referring to FIG. 10, a seventh exemplary structure 1095 according to a seventh embodiment of the present disclosure may be derived from any of the first through fifth exemplary structure of the present disclosure illustrated in FIGS. 8A and 8B by not forming shallow trench isolation structures 620 in the areas of the doped well structures 607.

Figure 11:
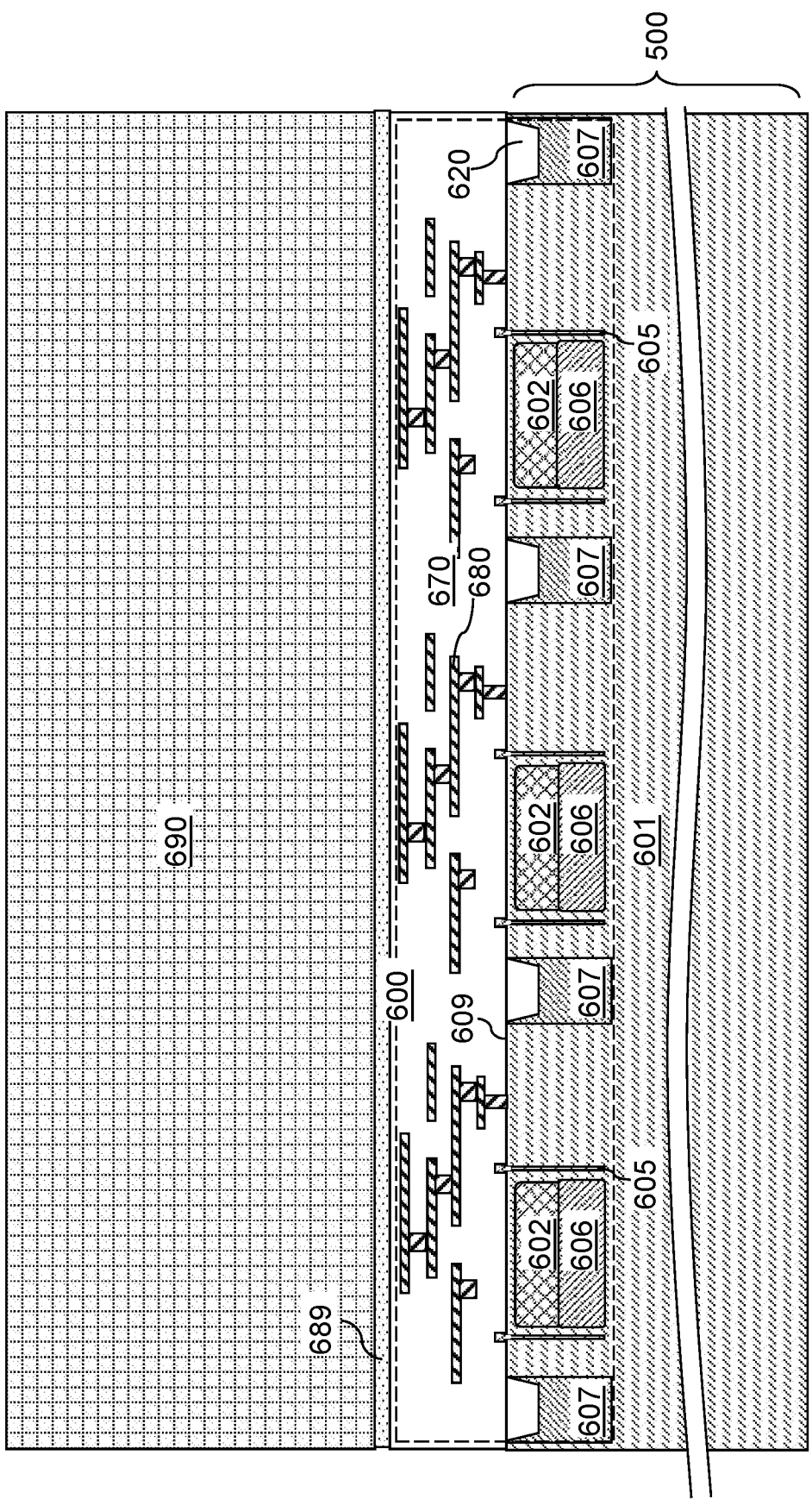
FIG. 11 is a vertical cross-sectional view of an exemplary structure after formation of metal interconnect structures formed within interconnect-level dielectric layers and attachment of a carrier substrate according to an embodiment of the present disclosure.

Referring to FIG. 11, additional interconnect-level dielectric layers 670 and additional metal interconnect structures 680 may be formed on the front side of the semiconductor substrate 500. The front surface 609 of the assembly of the semiconductor substrate 500, the interconnect-level dielectric layers 670, and the structures formed therein may be bonded to a carrier substrate 690. The carrier substrate 690 may be temporarily attached to the assembly of the semiconductor substrate 500 and the interconnect-level dielectric layers 670 to provide subsequent thinning of the semiconductor substrate 500, and to provide subsequent handling of the assembly of a thinned semiconductor substrate 510 and the interconnect-level dielectric layers 670. The carrier substrate 690 may include a semiconductor material, an insulating material, or a metallic material, and may have a thickness in a range from 300 microns to 1 mm, although lesser and greater thicknesses may also be used.

Any suitable bonding method may be used to bond the carrier substrate 690 to the front side of the interconnect-level dielectric layers 670. Exemplary bonding methods that may be used to bond the carrier substrate 690 to the interconnect-level dielectric layers 670 include, but are not limited to, oxide-to-oxide bonding, oxide-to-semiconductor bonding, fusion bonding, hybrid bonding, anodic bonding, direct bonding, other suitable bonding processes, and/or combinations thereof. Optionally, a bonding buffer layer 689 including an intermediate bonding material (e.g., silicon oxide, silicon nitride, or a semiconductor material) may be used to provide bonding between the interconnect-level dielectric layers 670 and the carrier substrate 690.

Figure 12:
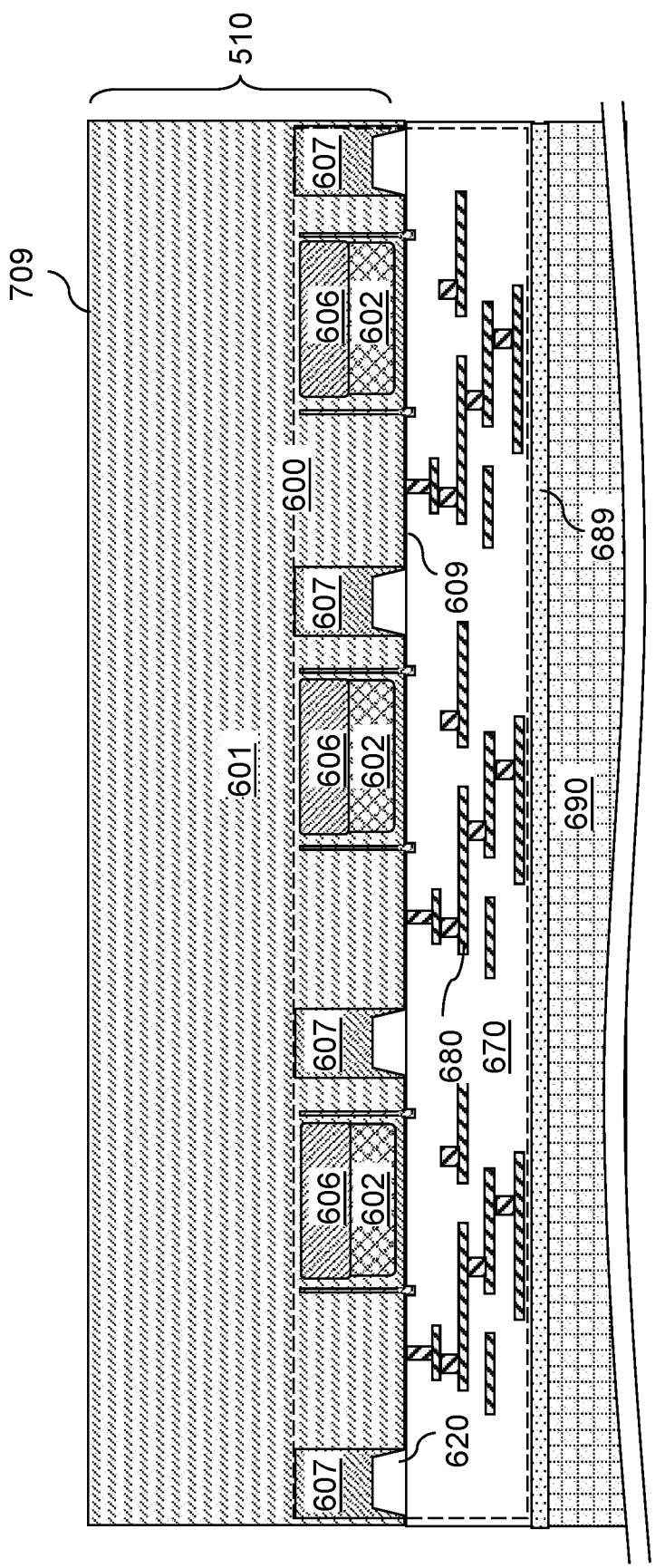
FIG. 12 is a vertical cross-sectional view of the exemplary structure after thinning a semiconductor substrate according to an embodiment of the present disclosure.

Referring to FIG. 12, the backside 610 of the semiconductor substrate 500 may be thinned, for example, by grinding, polishing, an isotropic etch process, and/or an anisotropic etch process. The carrier substrate 690 may provide mechanical support to the semiconductor substrate 500 during the thinning process. In one embodiment, the semiconductor substrate 500 may be thinned to a thickness in a range from 1 micron to 12 microns, such as from 1.5 microns to 8 microns, although lesser and greater thicknesses may also be used. The semiconductor substrate 500 as thinned after the thinning process is herein referred to as a thinned semiconductor substrate 510, or as a semiconductor substrate 510. The thickness of the thinned semiconductor substrate 510 may be determined by the maximum depth of deep trenches to be subsequently formed on the backside of the thinned semiconductor substrate 510. In one embodiment, the thickness of the thinned semiconductor substrate 510 may be selected such that deep trenches to be subsequently formed on the backside of the semiconductor substrate 510 reaches proximal surfaces of the shallow trench isolation structures 620. The backside surface 610 of the thinned semiconductor substrate 510 may be polished to provide a planar horizontal surface that is parallel to the front surface 609 of the thinned semiconductor substrate 510. The exemplary structure may be subsequently flipped upside down for further processing.

Figure 13:
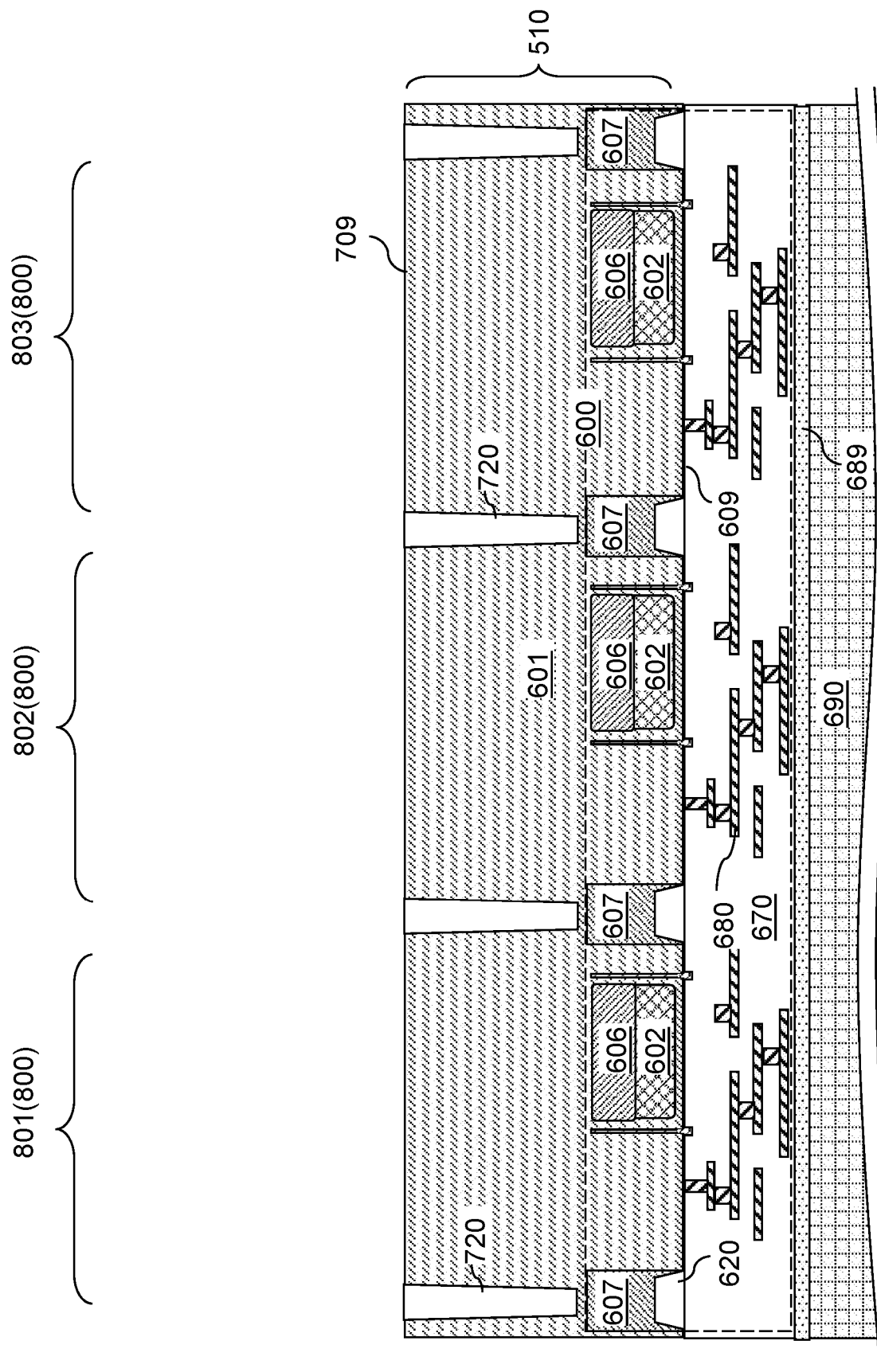
FIG. 13 is a vertical cross-sectional view of the exemplary structure after formation of deep trench isolation structures according to an embodiment of the present disclosure.

Referring to FIG. 13, a photoresist layer (not shown) may be applied over the backside surface 610 of the thinned semiconductor substrate 510, and may be lithographically patterned to form openings that generally replicate the pattern of the shallow trench isolation structures 620 located underneath. Unmasked portions of the semiconductor substrate 510 may be etched by performing an anisotropic etch process, which transfers the pattern of the openings in the photoresist layer into the semiconductor substrate 510. The depth of the deep trenches may be in a range from 1 micron to 10 microns, such as from 1.5 microns to 8 microns, although lesser and greater thicknesses may also be used. Deep trenches may be formed in the semiconductor substrate 510. The photoresist layer may be subsequently removed, for example, by ashing.

At least one dielectric material such as silicon oxide may be deposited in the deep trenches. Excess portions of the at least one dielectric material overlying the backside surface 610 of the thinned semiconductor substrate 510 may be removed by a planarization process. The planarization process may include a chemical mechanical planarization (CMP) process and/or a recess etch process. Remaining portions of the at least one dielectric material filling the deep trenches comprise deep trench isolation structures 720.

The deep trench isolation structures 720 may define areas for subpixels 800. Each subpixel 800 may be located within a respective subpixel region, which is located within a region of a pixel, i.e., within a pixel region. For example, an area of a pixel may include an area of a first subpixel 801, an area of a second subpixel 802, and an area of a third subpixel 803. In an illustrative example, the first subpixel 801 may be formed in a region that includes a photodetector configured to detect green light, the second subpixel 802 may be formed in a region that includes a photodetector configured to detect red light, and the third subpixel 803 may be formed in a region that includes a photodetector configured to detect blue light. Each subpixel 800 may include a volume containing a patterned columnar portion of the semiconductor substrate 510 that is laterally enclosed by a connected set of deep trenches. A pixel region of a pixel includes all subpixel regions for the set of subpixels 800 contained within the pixel.

Figure 14:
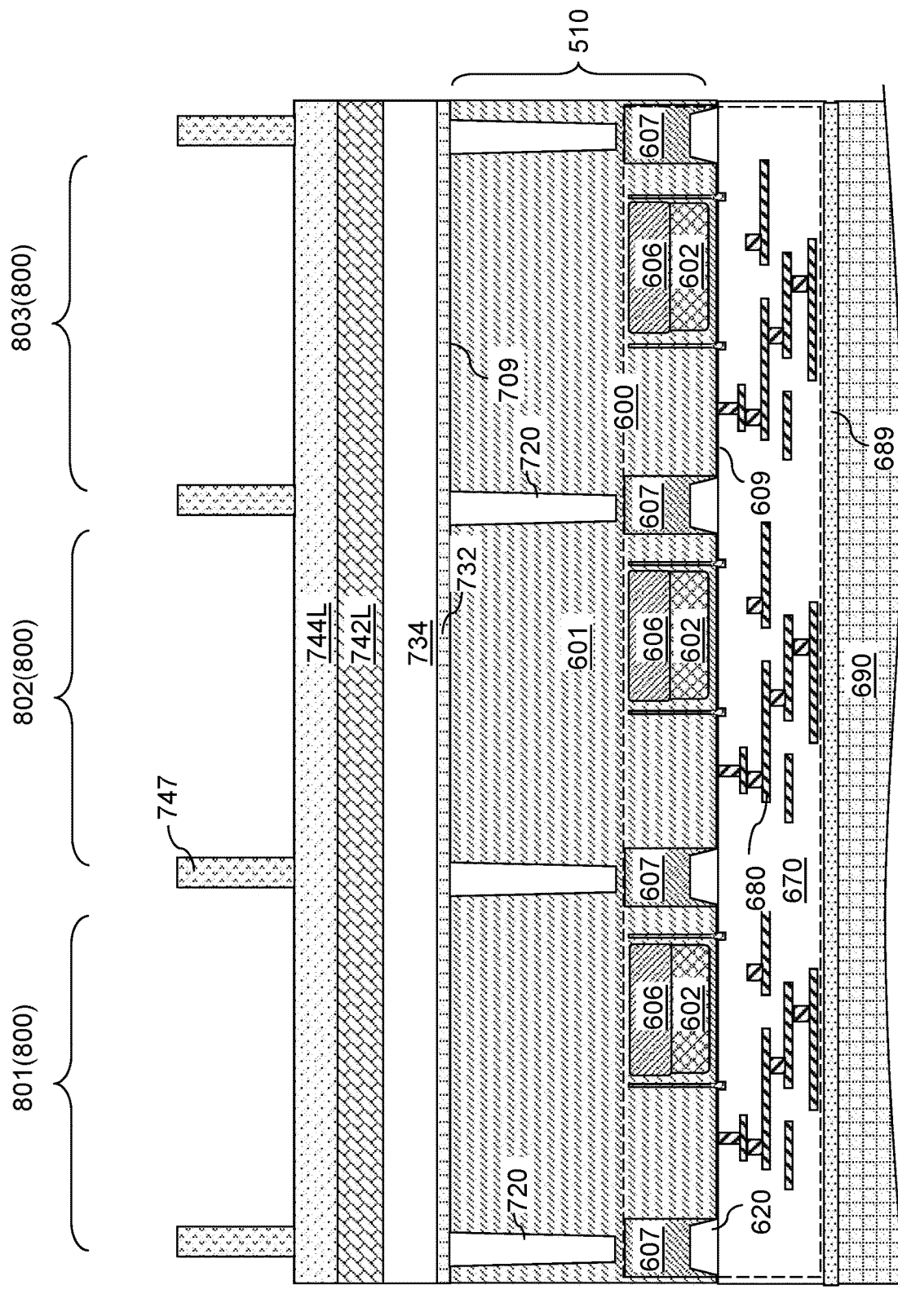
FIG. 14 is a vertical cross-sectional view of the exemplary structure after formation of an antireflective coating (ARC) layer, an optical refraction layer, a dielectric grid material layer, a metallic reflective material layer, and a patterned photoresist layer according to an embodiment of the present disclosure.

Referring to FIG. 14, an optional anti-reflective coating (ARC) layer 732, an optical buffer layer 734, a dielectric grid material layer 742L, and a metallic reflective material layer 744L may be sequentially deposited over the backside surface 610 of the semiconductor substrate 510.

The optional ARC layer 732 includes an antireflective coating material that reduces reflection between the semiconductor material of the semiconductor substrate 510 and the overlying material layer, i.e., the optical buffer layer 734. The optional ARC layer 732, if present, may have a refractive index that is between the refractive index of the semiconductor material of the semiconductor substrate 510 and the refractive index of the optical buffer layer 734. The optional ARC layer 732 may include a single material layer or a layer stack of multiple layers having gradually changing refractive indices. The optional ARC layer 732 includes an optically transparent material, and may include a semiconductor material, an insulating material, a conductive material, and/or a polymer material. The ARC layer 732 may have a thickness in a range from 50 nm to 300 nm, although lesser and greater thicknesses may also be used.

The optical buffer layer 734 includes a semiconductor material (such as silicon, germanium, a silicon-germanium alloy, or a III-V compound semiconductor material) or a dielectric material (such as silicon oxide, silicon oxynitride, silicon nitride, or a dielectric metal oxide (e.g., aluminum oxide)). The optical buffer layer 734 includes a material that is conducive to formation of trenches having a high aspect ratio during a subsequent anisotropic etch process. The optical buffer layer 734 may be formed as an unpatterned (blanket) material layer having two horizontal planar surfaces that are parallel to the backside surface 610 of the semiconductor substrate 510. The distal surface of the optical buffer layer 734 is one of the two horizontal planar surfaces of the optical buffer layer 734 that is more distal from the semiconductor substrate 510, i.e., a top surface of the optical buffer layer 734.

The dielectric grid material layer 742L may include a dielectric material such as silicon oxide, a porous dielectric material, polyimide, or another dielectric material. The thickness of the dielectric grid material layer may be in a range from 50 nm to 500 nm, although lesser and greater thicknesses may also be used. The metallic reflective material layer 744L may include a metallic material that may provide high reflectivity. For example, the metallic reflective material layer 744L may include silver, aluminum, copper, gold, or any other highly reflective metallic material. The thickness of the metallic reflective material layer 744L may be in a range from 50 nm to 500 nm, although lesser and greater thicknesses may also be used.

A photoresist layer 747 may be applied over the metallic reflective material layer 744L, and may be lithographically patterned to form openings within areas of the second-conductivity-type photodiode layers 602, i.e., within the areas of the photodetectors that include a respective p-n junction between the second-conductivity-type photodiode layers 602 and the doped well structures 607. The areas of the transistors of the sensing circuit (such as the reset transistors 640, the source follower transistors 650, and the select transistors 660) may, or may not, be covered by the photoresist layer 747.

Figure 15A:
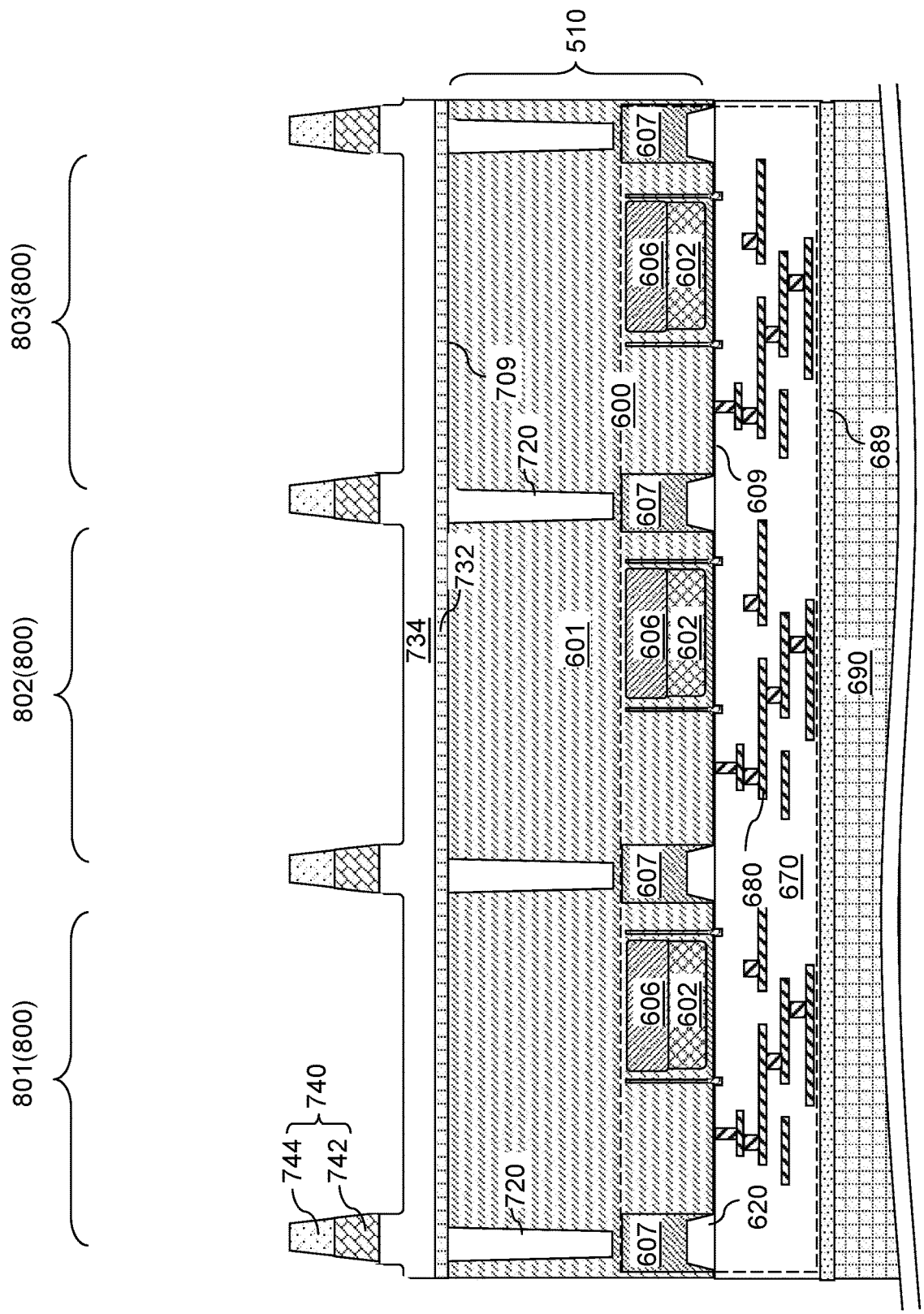
FIG. 15A is a vertical cross-sectional view of the exemplary structure after formation of a composite grid structure according to an embodiment of the present disclosure.
Figure 15B:
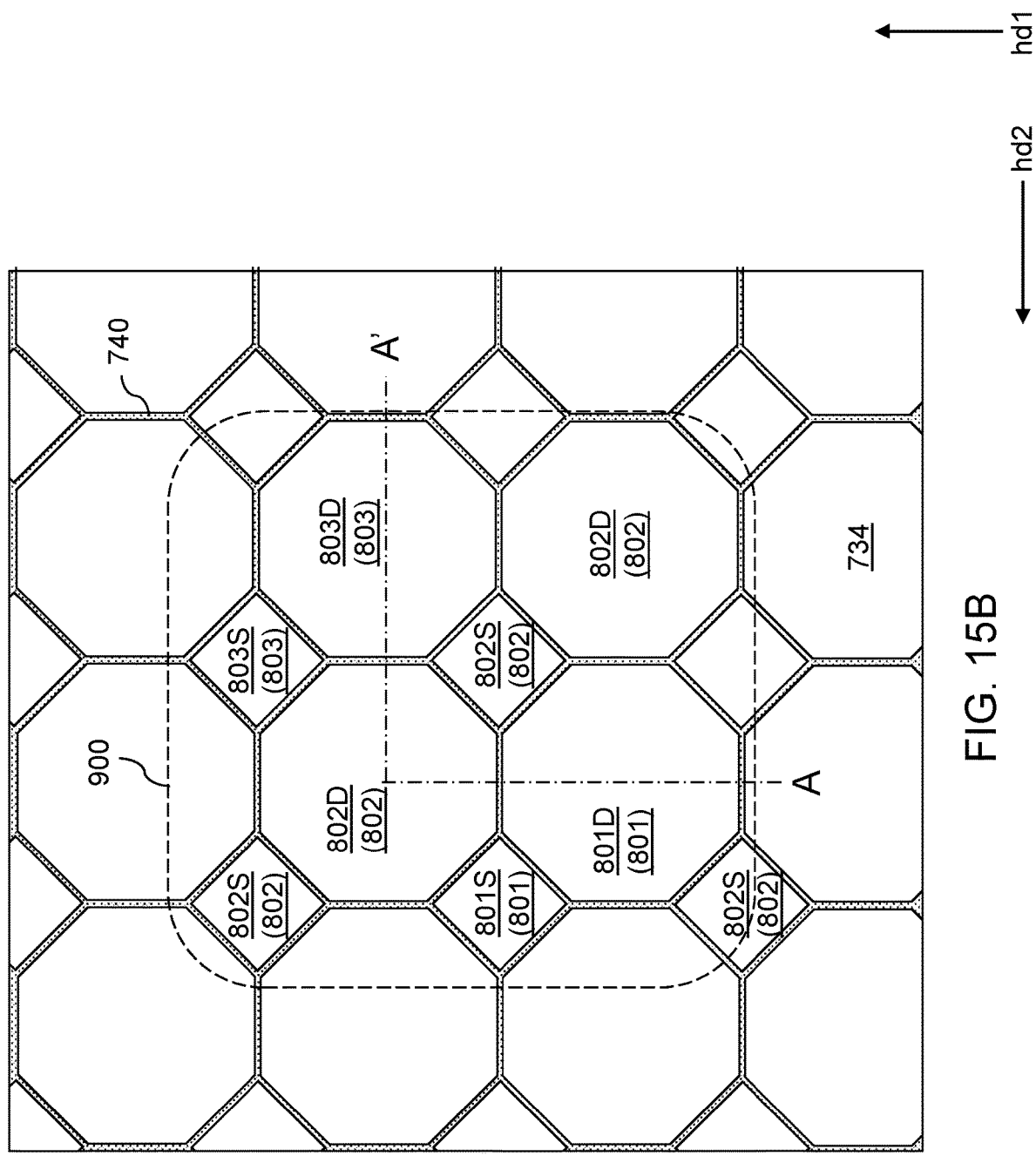
FIG. 15B is a plan view of the exemplary structure of FIG. 15A. The hinged vertical plane A-A' corresponds to the plane of the vertical cross-sectional view of FIG. 15A.

Referring to FIGS. 15A and 15B, portions of the dielectric grid material layer 742L and the metallic reflective material layer 744L that are not masked by the patterned portions of the photoresist layer 747 may be etched to form openings therethrough. Remaining portions of the dielectric grid material layer 742L form a dielectric grid structure 742, and remaining portions of the metallic reflective material layer 744L form a metallic grid structure 744. The stack of the dielectric grid structure 742 and the metallic grid structure 744 constitutes a grid structure 740, which is also referred to as a composite grid structure.

The grid structure 740 may overlie peripheries of the second-conductivity-type photodiode layers 602, and define a light collection area for each photodetector located within a respective subpixel 800. A pixel 900 may include a set of subpixels 800 (801, 802, 803) configured to detect light at different wavelengths. Each pixel 900 may be located within a respective pixel region, which includes a set of subpixels 800. For example, a pixel 900 may include at least one instance of a first subpixel 801, at least one instance of a second subpixel 802, and at least one instance of a third subpixel 803. In the illustrated example, a pixel may include a first subpixel 801 (such as a green subpixel) located in a first subpixel region, two second subpixels 802 (such as two red subpixels) located in two second subpixel regions, and a third subpixel 803 (such as a blue subpixel) located in a third subpixel region. Generally, a pixel 900 may include various combinations of at least two types of subpixels 800 configured to detect light at different wavelength ranges. Alternatively, an image sensor may be a monochromatic image sensor including a single type of subpixels 800. In such an embodiment, each pixel 900 may include only a single subpixel 800.

Generally, a grid structure 740 comprises at least a metallic grid structure 744 having reflective sidewalls. The grid structure 740 may comprise a composite grid structure including a vertical stack of a metallic grid structure 744 having reflective sidewalls and a dielectric grid structure 742. The grid structure 740 may be formed over the distal surface of the optical buffer layer 734. The grid structure 740 includes openings that overlie a respective one of the photodetectors comprising a transfer transistor 630. The portions of the distal surface of the optical buffer layer 734 that are contacted by the bottom surfaces of the grid structure are planar distal surface portions of the distal surface of the optical buffer layer 734. The portions of the distal surface of the optical buffer layer 734 that do not contact the grid structure 740 may be collaterally vertically recessed relative to the horizontal plane including the bottom surface of the grid structure during the anisotropic etch process that patterns the grid structure.

The grid structure 740 may divide each subpixel 800 into a detector region and a sensing circuit region. For example, a first subpixel 801 may include a first detector region 801D that overlies the second-conductivity-type photodiode layer 602 of the first subpixel 801, and a first sensing circuit region 801S that overlies the sensing circuit (640, 650, 660) of the first subpixel 801. A second subpixel 802 may include a second detector region 802D that overlies the second-conductivity-type photodiode layer 602 of the second subpixel 802, and a second sensing circuit region 802S that overlies the sensing circuit (640, 650, 660) of the second subpixel 802. A third subpixel 803 may include a third detector region 803D that overlies the second-conductivity-type photodiode layer 602 of the third subpixel 803, and a third sensing circuit region 803S that overlies the sensing circuit (640, 650, 660) of the third subpixel 803. Generally, the set of all subpixels 800 within a pixel 900 may be arranged in any pattern that is conducive to periodic repetition of the pixels 900 within an array 1000 of pixels 900.

Figure 16:
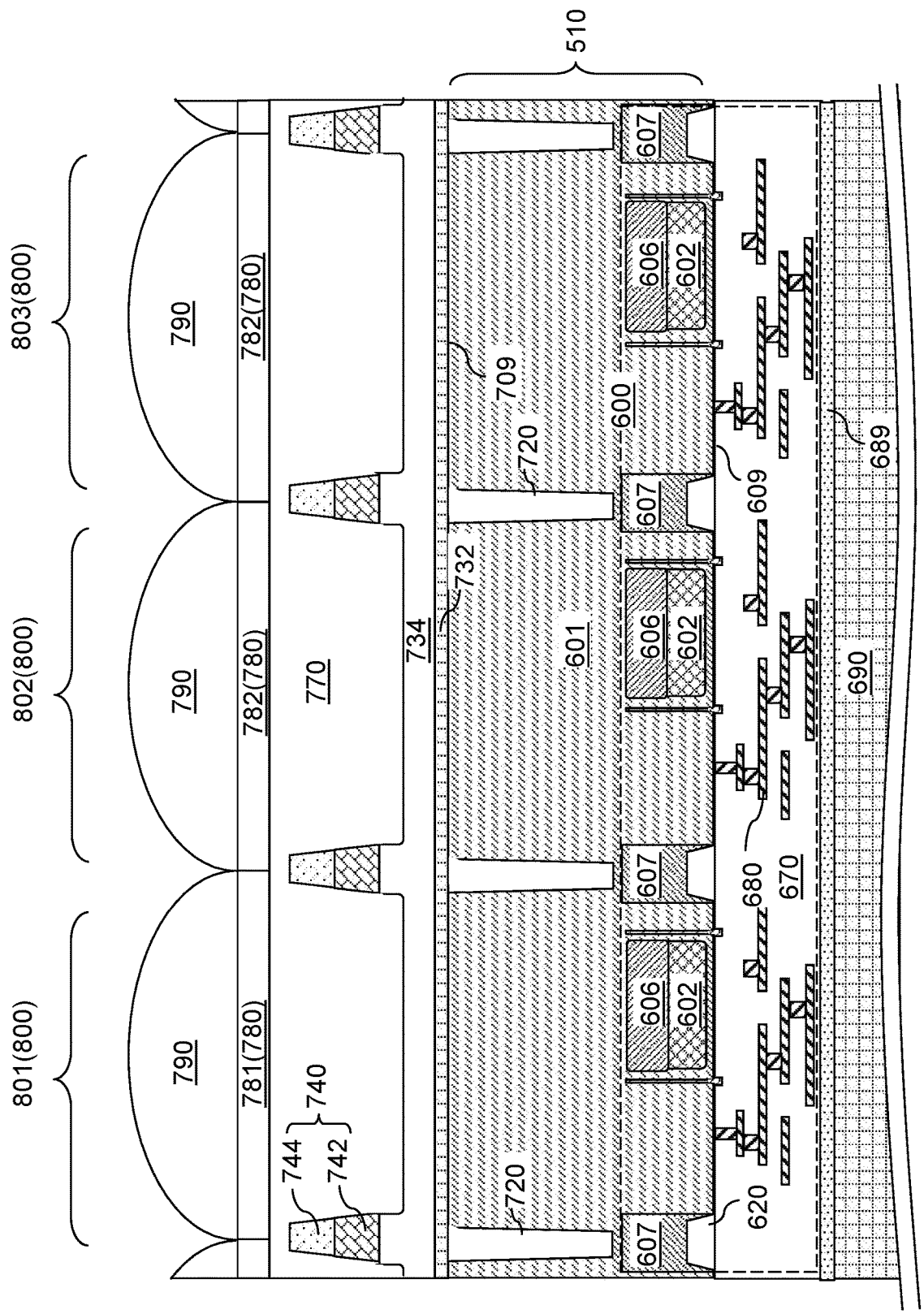
FIG. 16 is a vertical cross-sectional view of the exemplary structure after formation of an optically transparent layer, color filters, and lenses according to an embodiment of the present disclosure.

Referring to FIG. 16, an optically transparent layer 770 having a planar top surface may be formed over the grid structure 740. The optically transparent layer 770 may be formed by depositing a self-planarizing dielectric material such as flowable oxide (FOX). Alternatively, a transparent dielectric material may be deposited and planarized, for example, by chemical mechanical planarization to provide the optically transparent layer 770.

The optically transparent layer 770 vertically extends through the openings in the grid structure 740, and has a second refractive index that is different from the first refractive index. The optically transparent layer 770 may be formed on the optical buffer layer 734.

Various color filtering materials may be applied over the optically transparent layer 770, and may be patterned to form various color filters 780. The color filters 780 may include first-type color filters 781 formed within the regions of the first subpixels 801, second-type color filters 782 formed within the regions of the second subpixels 802, and third-type color filters 783 formed within the regions of the third subpixels 803. The composition of each color filtering material may be selected such that light within a target wavelength ranges passes through the color filtering material, while light outside the target wavelength range is absorbed by the color filtering material.

Optical lenses 790 may be formed over the color filters 780 by applying an optically transparent material over the color filters 780 and by patterning the optically transparent material into material portions having convex surfaces that are centered on a respective one of the underlying openings within the grid structure 740.

Each combination of portions of the optional ARC layer 732, the optical buffer layer 734, the grid structure 740, and the optically transparent layer 770 located within a subpixel 800, an overlying color filter 780, and an overlying optical lens 790 constitutes an optics assembly that is configured to filter and focus light onto a respective photodetector.

Figure 17:
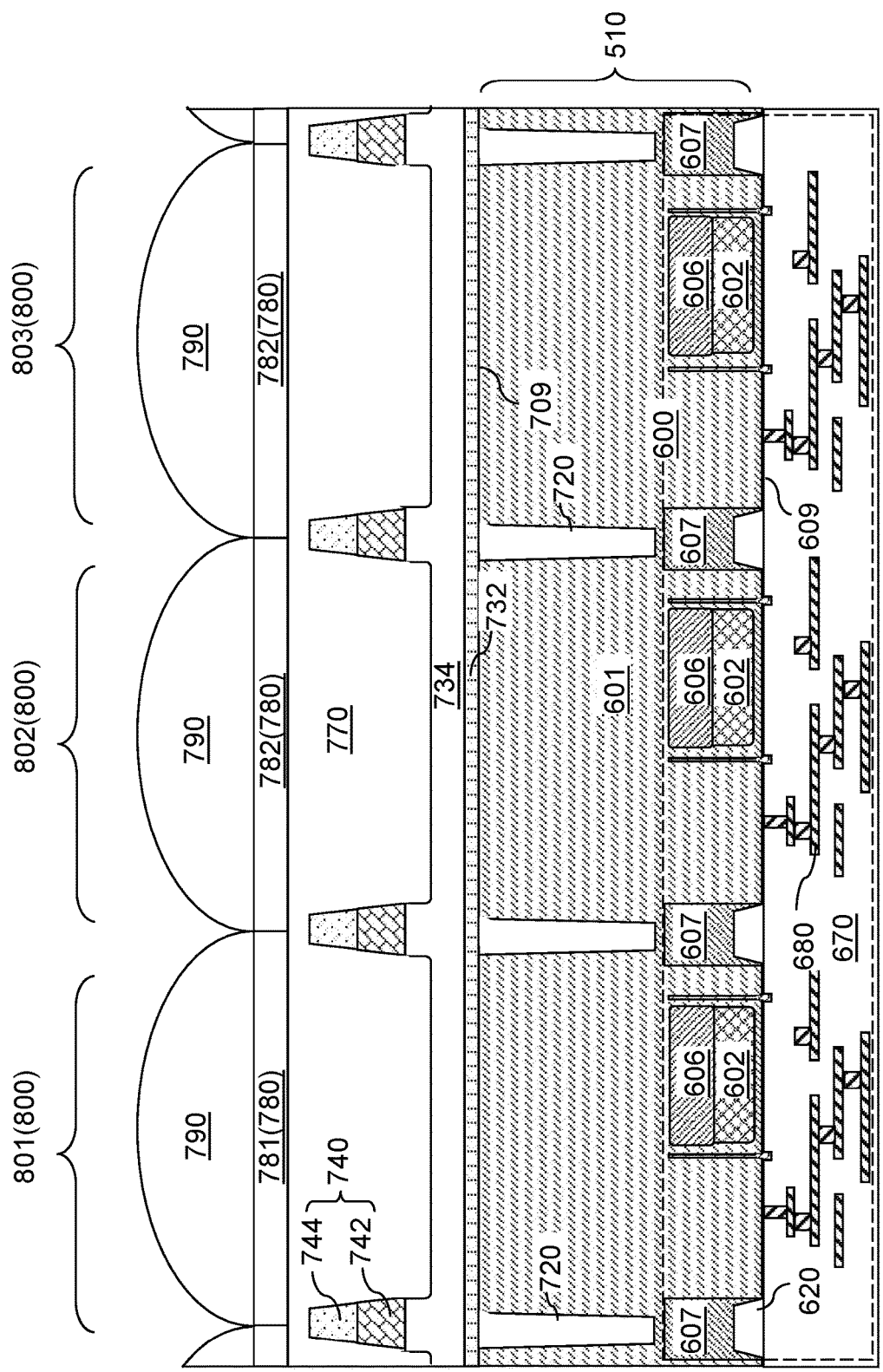
FIG. 17 is a vertical cross-sectional view of the exemplary structure after removal of the carrier substrate according to an embodiment of the present disclosure.

Referring to FIG. 17, the carrier substrate 690 and the bonding buffer layer 689 (if present) may be detached from the interconnect-level dielectric layers 670. The semiconductor substrate 510 and the device structures thereupon may be singulated into discrete image sensors prior to, or after, detaching the carrier substrate 690 from the semiconductor substrate 510.

Generally, an array 1000 of pixels may be formed on the semiconductor substrate 510. Each pixel within the array 1000 of pixels comprises at least one subpixel, and each subpixel comprise a respective photodetector (comprising a transfer transistor 630) and a respective sensing circuit (640, 650, 660) located on a front surface 609 of the semiconductor substrate 510.

Figure 18:
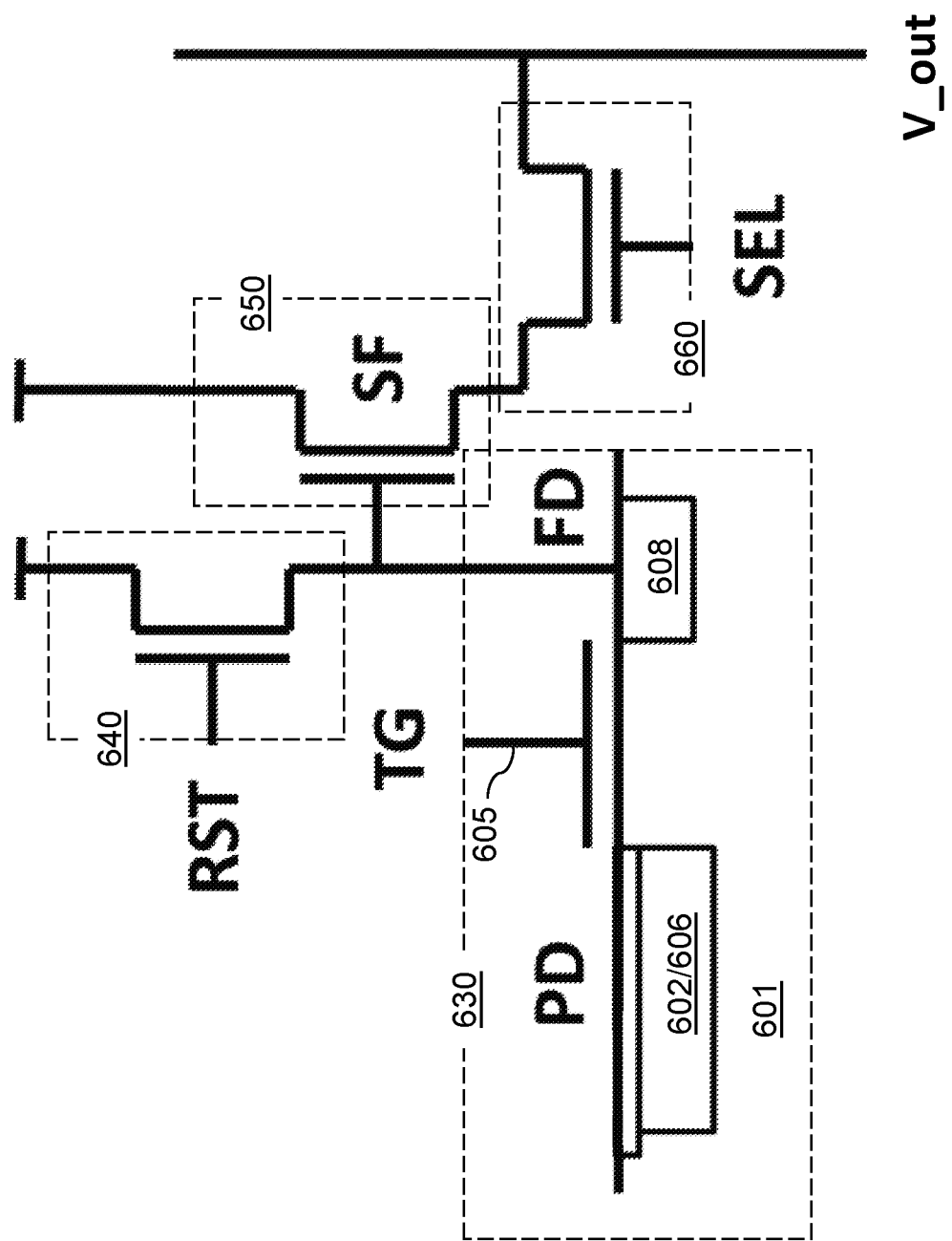
FIG. 18 is a schematic circuit diagram of a photodetector circuit according to an embodiment of the present disclosure.

Referring to FIG. 18, a circuit schematic for a photodetector circuit is illustrated according to an embodiment of the present disclosure. The configuration of the photodetector circuit includes a transfer transistor 630 and an interconnected assembly of field effect transistors (640, 650, 660). The transfer transistor 630 may include a p-n junction between the combination of a second-conductivity-type photodiode layer 602 and a buried second-conductivity-type photodiode layer 606 and the substrate semiconductor layer 601 having a doping of the first conductivity type. The set of the substrate semiconductor layer 601, the buried second-conductivity-type photodiode layer 606, the second-conductivity-type photodiode layer 602 (labeled as "PD"). The second-conductivity-type photodiode layer 602 functions as a source region of the transfer transistor 630.

A floating diffusion region 608 (labeled as "FD") functions as a drain region of the transfer transistor 630. A transfer gate electrode 605 (labeled as "TG") controls the transfer of the electrical charges accumulated in the second-conductivity-type photodiode layer 602 into the floating diffusion region 608 through a semiconductor channel that underlies the transfer gate electrode 605. The transfer transistor 630 may function as a photodetector.

The sensing circuit includes the interconnected assembly of field effect transistors (640, 650, 660). The interconnected assembly of the field effect transistors (640, 650, 660) is connected to the floating diffusion region 608. The interconnected assembly of the field effect transistors (640, 650, 660) includes a reset transistor (labeled as "RST"), a source follower transistor SF, and a select transistor (labeled as "SEL"). The reset transistor 640 (i.e., RST) may be configured to drain the electrical charges in the floating diffusion region 608 immediately before sensing so that the electrical charge that accumulates in the floating diffusion region 608 during sensing is linearly proportional to the electrical charge accumulated in the second-conductivity-type photodiode layer 602. The gate electrode of the source follower transistor 650 (i.e., SF) is electrically connected to the floating diffusion region 608 via a set of metal interconnect structures. Thus, the voltage at the gate electrode of the source follower transistor 650 may be proportional to the electrical charges in the floating diffusion region 608. The select transistor 660 (i.e., SEL) may be turned on during a read operation to output the voltage at a common node of the source follower transistor and the select transistor 660 (as modulated by the voltage at the gate electrode of the source follower transistor 650) to a column output bus (labeled as "V_out").

Referring to FIGS. 1A-18 and according to various embodiments of the present disclosure, a semiconductor structure comprising a photodetector (comprising transfer transistor 630) is provided. The photodetector comprises a substrate semiconductor layer 601 having a doping of a first conductivity type, a second-conductivity-type photodiode layer 602 that forms a p-n junction with the substrate semiconductor layer 601, a floating diffusion region 608 that is laterally spaced from the second-conductivity-type photodiode layer 602, and a transfer gate electrode 605 including a lower transfer gate electrode portion 605L that is formed within the substrate semiconductor layer 601 and located between the second-conductivity-type photodiode layer 602 and the floating diffusion region 608.

Further, the various embodiments of the present disclosure provide an image sensor comprising a plurality of pixels 900 located on a substrate semiconductor layer 601 having a doping of a first conductivity type. Each individual pixel 900 within the plurality of pixels 900 may comprise a photodetector circuit that includes a photodetector (comprising transfer transistor 630) and a sensing circuit (640, 650, 660). Each photodetector comprises a second-conductivity-type photodiode layer 602 that forms a p-n junction with the substrate semiconductor layer 601, a floating diffusion region 608 that is laterally spaced from the second-conductivity-type photodiode layer 602 and located on a front-side horizontal surface of the substrate semiconductor layer 601, and a transfer gate electrode 605 including a lower transfer gate electrode portion 605L that is formed within the substrate semiconductor layer 601 and located between the second-conductivity-type photodiode layer 602 and the floating diffusion region 608. Each pixel 900 within the plurality of pixels 900 comprises a respective optics assembly located on a backside horizontal surface of the substrate semiconductor layer 601 and configured to direct incoming light to a respective one of the p-n junctions of the photodetectors.

In one embodiment, a plurality of trenches 639 may be located within the substrate semiconductor layer 601. The plurality of trenches 639 may vertically extend from the front-side horizontal surface of the substrate semiconductor layer 601 (on which the photodetectors are located) toward the backside horizontal surface of the substrate semiconductor layer 601 (on which the optics assemblies are located). Each of the lower transfer gate electrode portions 605L may be located within a respective one of the plurality of trenches 639.

Figure 19:
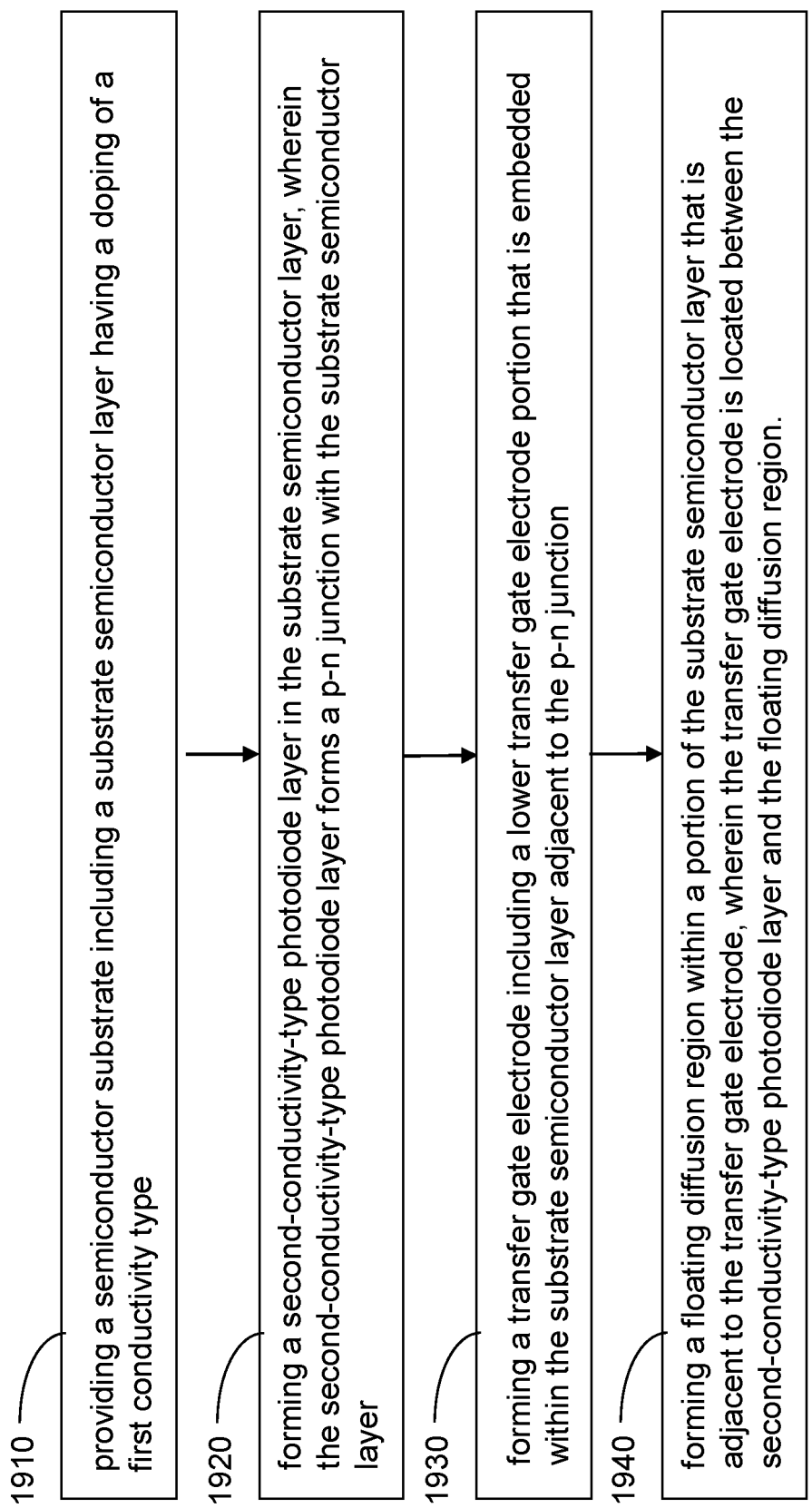
FIG. 19 is a process flow diagram illustrating an exemplary process sequence for forming a semiconductor structure including a photodetector according to an embodiment of the present disclosure.

Referring to FIG. 19, a process flow diagram illustrates an exemplary process sequence for forming a semiconductor structure including a photodetector according to an embodiment of the present disclosure. Referring to step 1910, a semiconductor substrate 500 including a substrate semiconductor layer 601 having a doping of a first conductivity type may be provided. Referring to step 1920, a second-conductivity-type photodiode layer 602 may be formed in the substrate semiconductor layer 601. The second-conductivity-type photodiode layer 602 forms a p-n junction with the substrate semiconductor layer 601. Referring to step 1930, a transfer gate electrode 605 may be formed, which includes a lower transfer gate electrode portion 605L that is formed within the substrate semiconductor layer 601 adjacent to the p-n junction. Referring to step 1940, a floating diffusion region 608 is formed within a portion of the substrate semiconductor layer 601 that is adjacent to the transfer gate electrode 605. The transfer gate electrode 605 is located between the second-conductivity-type photodiode layer 602 and the floating diffusion region 608.

The various methods and structures of the present disclosure may be used to provide a photodetector circuit in which transfer of electrical charges from a photodiode region to a floating diffusion region 608 is controlled by a buried transfer gate electrode 605 that includes portions located within a trench disposed between the photodiode region and the floating diffusion region 608. Leakage of the stored electrical charges in the photodiode region is minimized, and charge transfer from the photodiode region to the floating diffusion region 608 occurs only when the buried transfer gate electrode 605 is turned on. Thus, high fidelity optional images may be generated through use of the buried transfer gate electrodes 605 of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising a photodetector, wherein the photodetector comprises:
a substrate semiconductor layer having a doping of a first conductivity type;
a second-conductivity-type photodiode layer that forms a p-n junction with the substrate semiconductor layer;
a floating diffusion region that is laterally spaced from the second-conductivity-type photodiode layer;
a transfer gate electrode including a lower transfer gate electrode portion that is formed within the substrate semiconductor layer and located between the second-conductivity-type photodiode layer and the floating diffusion region; and
at least one additional transfer gate electrode located within the substrate semiconductor layer, wherein the transfer gate electrode and the at least one additional transfer gate electrode are located around a periphery of the second-conductivity-type photodiode layer and are laterally spaced apart from one another.

2. The semiconductor structure of claim 1, wherein:
the photodetector comprises a trench located within the substrate semiconductor layer and vertically extending from a front-side horizontal surface of the substrate semiconductor layer toward a backside horizontal surface of the substrate semiconductor layer; and
the lower transfer gate electrode portion is located within the trench.

3. The semiconductor structure of claim 2, wherein the trench has a greater depth than a vertical thickness of the floating diffusion region.

4. The semiconductor structure of claim 1, wherein the transfer gate electrode comprises an upper transfer gate electrode portion located over the substrate semiconductor layer and having a greater lateral extent than the lower transfer gate electrode portion.

5. The semiconductor structure of claim 4, wherein a peripheral region of the upper transfer gate electrode portion has an area overlap with a peripheral region of the floating diffusion region in a plan view along a direction that is perpendicular to a front-side horizontal surface of the substrate semiconductor layer.

6. The semiconductor structure of claim 1, wherein the lower transfer gate electrode portion is located within a moat trench that laterally surrounds the second-conductivity-type photodiode layer.

7. The semiconductor structure of claim 6, wherein the lower transfer gate electrode portion comprises a planar bottom surface having an inner periphery and an outer periphery that laterally surround the second-conductivity-type photodiode layer at a same depth from a front-side horizontal surface of the substrate semiconductor layer.

8. The semiconductor structure of claim 6, wherein the lower transfer gate electrode portion comprises a castellated bottom region having multiple bottom surface segments that are adjoined to one another by vertical sidewalls of the lower transfer gate electrode portion.

9. The semiconductor structure of claim 1, further comprising at least one additional floating diffusion region that is laterally spaced from the floating diffusion region and is laterally spaced from the second-conductivity-type photodiode layer.

10. The semiconductor structure of claim 1, further comprising at least one additional floating diffusion region that is laterally spaced from the second-conductivity-type photodiode layer, wherein each of the at least one additional transfer gate electrode is located between the second-conductivity-type photodiode layer and a respective one of the at least one additional floating diffusion region.

11. The semiconductor structure of claim 1, wherein the lower transfer gate electrode portion has a vertical cross-sectional profile in which a width of the lower transfer gate electrode portion decreases stepwise at least once with a vertical distance from a front-side horizontal top surface of the substrate semiconductor layer.

12. The semiconductor structure of claim 1, further comprising a doped well structure including dopants of the first conductivity type at a greater atomic concentration than the substrate semiconductor layer and laterally surrounding a region of the lower transfer gate electrode portion that is not adjoined to the floating diffusion region.

13. An image sensor comprising a plurality of pixels located on a substrate semiconductor layer having a doping of a first conductivity type, wherein each pixel within the plurality of pixels comprises a photodetector circuit that includes a photodetector and a sensing circuit, wherein each photodetector comprises:
 a second-conductivity-type photodiode layer that forms a p-n junction with the substrate semiconductor layer;
 a floating diffusion region that is laterally spaced from the second-conductivity-type photodiode layer and located on a front-side horizontal surface of the substrate semiconductor layer;
 a transfer gate electrode including a lower transfer gate electrode portion that is formed within the substrate semiconductor layer and located between the second-conductivity-type photodiode layer and the floating diffusion region; and
 at least one additional transfer gate electrode located within the substrate semiconductor layer, wherein the transfer gate electrode and the at least one additional transfer gate electrode are located around a periphery of the second-conductivity-type photodiode layer and are laterally spaced apart from one another,
 and wherein each pixel within the plurality of pixels comprises a respective optics assembly located on the substrate semiconductor layer and configured to direct incoming light to a respective one of the p-n junctions of the photodetectors.

14. The image sensor of claim 13, further comprising a plurality of trenches located within the substrate semiconductor layer and vertically extending from the front-side horizontal surface of the substrate semiconductor layer toward the backside horizontal surface of the substrate semiconductor layer, wherein each of the lower transfer gate electrode portions is located within a respective one of the plurality of trenches.

15. A semiconductor structure comprising a photodetector, wherein the photodetector comprises:
 a substrate semiconductor layer having a doping of a first conductivity type;
 a second-conductivity-type photodiode layer that forms a p-n junction with the substrate semiconductor layer;
 a floating diffusion region that is laterally spaced from the second-conductivity-type photodiode layer and located on a front-side horizontal surface of the substrate semiconductor layer;
 a transfer gate electrode including a lower transfer gate electrode portion located within the substrate semiconductor layer and between the second-conductivity-type photodiode layer and the floating diffusion region;
 at least one additional transfer gate electrode located within the substrate semiconductor layer, wherein the transfer gate electrode and the at least one additional transfer gate electrode are located around a periphery of the second-conductivity-type photodiode layer and are laterally spaced apart from one another; and
 an optics assembly located on a backside horizontal surface of the substrate semiconductor layer and configured to direct incoming light to a respective one of the p-n junctions of the photodetectors.

16. The semiconductor structure of claim 15, further comprising a trench located within the substrate semiconductor layer and vertically extending from the front-side horizontal surface of the substrate semiconductor layer toward the backside horizontal surface of the substrate semiconductor layer, wherein the lower transfer gate electrode portions is located within the trench.

17. The semiconductor structure of claim 15, wherein the transfer gate electrode comprises an upper transfer gate electrode portion located over the substrate semiconductor layer and having a greater lateral extent than the lower transfer gate electrode portion.

18. The semiconductor structure of claim 15, wherein the lower transfer gate electrode portion is located within a moat trench that laterally surrounds the second-conductivity-type photodiode layer.

19. The semiconductor structure of claim 15, further comprising at least one additional floating diffusion region that is laterally spaced from the floating diffusion region and is laterally spaced from the second-conductivity-type photodiode layer.

20. The semiconductor structure of claim 15, wherein the lower transfer gate electrode portion has a vertical cross-sectional profile in which a width of the lower transfer gate electrode portion decreases stepwise at least once with a vertical distance from a front-side horizontal top surface of the substrate semiconductor layer.

* * * * *